(12) United States Patent
Scaggs

(10) Patent No.: US 10,942,275 B2
(45) Date of Patent: Mar. 9, 2021

(54) SYSTEM AND METHOD FOR IMPROVING SIGNAL-TO-NOISE RATIO IN A LASER IMAGING SYSTEM

(71) Applicant: Haas Laser Technologies, Inc., Flanders, NJ (US)

(72) Inventor: Michael J. Scaggs, Weston, FL (US)

(73) Assignee: Haas Laser Technologies, Inc., Flanders, NJ (US)

( * ) Notice: Subject to any disclaimer, the term of this patent is extended or adjusted under 35 U.S.C. 154(b) by 75 days.

(21) Appl. No.: 16/267,381

(22) Filed: Feb. 4, 2019

(65) Prior Publication Data

US 2020/0033477 A1    Jan. 30, 2020

Related U.S. Application Data

(63) Continuation-in-part of application No. 16/048,226, filed on Jul. 28, 2018, now Pat. No. 10,708,537.

(51) Int. Cl.
  *G01S 17/89* (2020.01)
  *H01L 27/146* (2006.01)
  (Continued)

(52) U.S. Cl.
  CPC .............. *G01S 17/89* (2013.01); *G02B 5/20* (2013.01); *G02B 27/0955* (2013.01);
  (Continued)

(58) Field of Classification Search
  CPC ...... G01S 17/89; G01S 7/4811; G01S 7/4876; G02B 27/0955; G02B 27/0972;
  (Continued)

(56) References Cited

U.S. PATENT DOCUMENTS

| | | |
|---|---|---|
| 4,384,198 A | 5/1983 | Williamson |
| 5,064,284 A | 11/1991 | Johnston, Jr. et al. |

(Continued)

FOREIGN PATENT DOCUMENTS

| | | |
|---|---|---|
| JP | S5979122 A | 5/1984 |
| JP | H09-38790 A | 2/1997 |

(Continued)

OTHER PUBLICATIONS

International Search Report and Written Opinion for PCT/US2011/031776 (filing date: Apr. 8, 2011) dated Jan. 2, 2012; Applicant: Michael J. Scaggs.

(Continued)

*Primary Examiner* — Amy R Hsu
(74) *Attorney, Agent, or Firm* — Molly L. Sauter; Smith & Hopen, P.A.

(57) ABSTRACT

A method and apparatus for improving measurements of a laser beam in a laser imaging system. The method includes, positioning an apodizing filter having a transmission profile that approaches a maximum at its edges between a pixelated detector and a laser source. The method further includes, emitting a laser beam from the laser source onto the apodizing filter and transmitting a portion of the laser incident upon the apodizing filter to the pixelated detector in accordance with the transmission profile of the apodizing filter such that the signal-to-noise ratio of the portion of the laser incident upon the pixelated detector is improved. The apodizing filter may be selected from a linear apodizing filter, a radial apodizing filter and a prism apodizing filter.

20 Claims, 15 Drawing Sheets

(51) Int. Cl.
G02B 27/09 (2006.01)
G02B 5/20 (2006.01)

(52) U.S. Cl.
CPC ...... G02B 27/0972 (2013.01); H01L 27/1464 (2013.01); H01L 27/14629 (2013.01)

(58) Field of Classification Search
CPC ...... G02B 27/0988; G02B 5/003; G02B 5/20; H01L 27/14629; H01L 27/1464
See application file for complete search history.

(56) References Cited

U.S. PATENT DOCUMENTS

| | | | |
|---|---|---|---|
| 5,069,527 | A | 12/1991 | Johnston, Jr. et al. |
| 5,078,491 | A | 1/1992 | Johnston, Jr. |
| 5,100,231 | A | 3/1992 | Sasnett et al. |
| 5,111,343 | A * | 5/1992 | Harrigan ............... G02B 5/205 359/885 |
| 5,214,485 | A | 5/1993 | Sasnett et al. |
| 5,267,012 | A | 11/1993 | Sasnett et al. |
| 5,329,350 | A | 7/1994 | Wright et al. |
| 5,459,565 | A | 10/1995 | Aharon |
| 5,521,759 | A | 5/1996 | Dobrowolski et al. |
| 5,638,220 | A * | 6/1997 | Ohtomo ............. G02B 27/0927 359/558 |
| 6,028,671 | A | 2/2000 | Svetkoff et al. |
| 6,201,909 | B1 * | 3/2001 | Kewitsch ........... G02B 6/02114 385/16 |
| 6,313,910 | B1 | 11/2001 | Garvey et al. |
| 6,411,371 | B1 * | 6/2002 | Hinderling ............ G01S 7/4812 356/4.01 |
| 6,497,490 | B1 | 12/2002 | Miller et al. |
| 6,596,982 | B1 | 7/2003 | Skokan et al. |
| 7,957,449 | B2 | 6/2011 | Wakabayashi et al. |
| 8,237,922 | B2 | 8/2012 | Scaggs |
| 9,513,417 | B2 * | 12/2016 | Uchiyama ............... G02B 1/115 |
| 2002/0021728 | A1 | 2/2002 | Newman et al. |
| 2005/0220163 | A1 | 10/2005 | Okuta et al. |
| 2007/0297483 | A1 | 12/2007 | Wakabayashi et al. |
| 2008/0165320 | A1 * | 7/2008 | Heiberger ............... A61B 3/103 351/206 |
| 2016/0291223 | A1 * | 10/2016 | Rudigier-Voigt ...... B05D 1/005 |
| 2016/0291233 | A1 * | 10/2016 | Trutna ................. G02B 6/0091 |

FOREIGN PATENT DOCUMENTS

| | | |
|---|---|---|
| JP | H11-8427 A | 1/1999 |
| JP | 2002-176007 A | 6/2002 |
| JP | 2005-101202 A | 4/2005 |
| JP | 2005-236327 A | 9/2005 |
| JP | 2008-122202 A | 5/2008 |
| JP | 2008-292404 A | 12/2008 |

OTHER PUBLICATIONS

International Preliminary Report on Patentability for PCT/US2011/031776 (filing date: Apr. 8, 2011) dated Apr. 8, 2010; Applicant: Haas Laser Technologies, Inc. et al.
First Chinese Office Action for Chinese Application: 201180028392.7 dated Apr. 21, 2014; Applicant: Haas Laser Technologies, Inc. et al.
Translation of First Chinese Office Action for Chinese Application: 201180028392.7 dated Apr. 21, 2014; Applicant: Haas Laser Technologies, Inc. et al.
Second Chinese Office Action for Chinese Application: 201180028392.7 dated Oct. 10, 2014; Applicant: Haas Laser Technologies Inc. et al.
Translation of Second Chinese Office Action for Chinese Application: 201180028392.7 dated Oct. 10, 2014; Applicant: Haas Laser Technologies, Inc. et al.
Third Chinese Office Action for Chinese Application: 201180028392.7 dated Apr. 10, 2015; Applicant: Haas Laser Technologies, Inc. et al.
Translation of Third Chinese Office Action for Chinese Application: 201180028392.7 dated Apr. 10, 2015; Applicant: Haas Laser Technologies, Inc. et al.
Scaggs and Haas. Real time laser beam analysis system for high power lasers. Proc. of SPIE. 2011. vol. 7913: 791306-1-791306-9.
European Patent Office Form 1507S (Supplementary Search Report) for European Application No. 11766817.8 dated Nov. 8, 2017; Applicant: Haas Laser Technologies, Inc.
European Patent Office Form 2001 (Communication pursuant to Article 94(3) EPC) for European Application No. 11766817.8 dated Jul. 9, 2018; Applicant: Haas Laser Technologies, Inc.
Japanese Notification of Reason(s) for Refusal for Japanese Application: 2013-503987 dated Sep. 3, 2014; Applicant: Haas Laser Technologies, Inc.
Translation of Japanese Notification of Reason(s) for Refusal for Japanese Application: 2013-503987 dated Sep. 3, 2014; Applicant: Haas Laser Technologies, Inc.
Indian First Examination Report for Indian Application 9267/CHENP/2012 dated Dec. 3, 2018; Applicant: Haas Laser Technologies, Inc.
Translation of Japanese Patent Application JP2002176007A with a publication date of Jun. 21, 2002.
Translation of Japanese Patent Application JP2005101202A with a publication date of Apr. 14, 2005.
Translation of Japanese Patent Application JP2005236327A with a publication date of Sep. 2, 2005.
Translation of Japanese Patent Application JP2008122202A with a publication date of May 29, 2008.
Translation of Japanese Patent Application JP2008292404A with a publication date of Dec. 4, 2008.
Translation of Japanese Patent Application JPH118427A with a publication date of Jan. 12, 1999.
Translation of Japanese Patent Application JPH0938790A with a publication date of Feb. 10, 1997.
Translation of Japanese Patent Application JPS5979122A with a publication date of May 8, 1984.
CCD Camera Beam Profiler, Thorlabs, https://www.thorlabs.com/newgrouppage9.cfm?objectgroup_id=3483, last accessed Jan. 28, 2020.
NG9 Data Sheet, Schott, 2013, retrieved from https://shop.schott.com/advanced_optics/Products/Optical-Filter-Glass/Matt-Filter-Plates/Neutral-density/NG9/c/matt-plate/glass-NG9, last accessed Jan. 28, 2020.
Unmounted Absorptive Neutral Density Filters, Thorlabs, https://www.thorlabs.com/newgrouppage9.cfm?objectgroup_id=5011, last accessed Jan. 28, 2020.
Unmounted UV Fused Silica Reflective ND Filters, Thorlabs, https://www.thorlabs.com/newgrouppage9.cfm?objectgroup_id=6106, last accessed Jan. 28, 2020.

* cited by examiner

SYSTEM AND METHOD FOR IMPROVING SIGNAL-TO-NOISE RATIO IN A LASER IMAGING SYSTEM

CROSS-REFERENCE TO RELATED APPLICATIONS

This application is a continuation-in-part of currently pending U.S. patent application Ser. No. 16/048,226 filed on Jul. 28, 2018 and entitled, "System and Method for Reducing Ghost Images in a Laser Imaging System", the entirety of which is incorporated herein by reference.

BACKGROUND OF THE INVENTION

Laser imaging systems are known in the art for analyzing laser beams and for observing a laser interaction area in material processing.

Ghost images at an image plane in a laser imaging system, such as on a pixelated detector of a Charged Coupled Device (CCD) or Complementary Metal-Oxide-Semiconductor (CMOS) digital camera, or other digital imaging system, are caused by reflections of light from the optical media of the imaging system, wherein the optical media have non-zero reflection and transmission coefficients. The non-zero reflection and transmission of light is a result of the difference in the refractive index on either side of the interface. At the interface, a portion of the incident light from a laser beam is transmitted at the surface of the optical media, while another portion of the incident light is reflected. The reflected light then propagates back to another optical media surface, which is reflected again and eventually propagates to the image plane, resulting in the pixelated detector sensing a ghost image. The ghost image is undesirable because it negatively affects the ability of the pixelated detector to accurately measure the laser beam or distort an image.

While anti-reflection coatings for the optical media are known in the art for reducing the ghost images, the known anti-reflection coatings are not effective in mitigating the ghost reflections in applications utilizing pixelated detectors that are extremely sensitive to the ghost images or when the wavelength band is broader then about 25 nm to 50 nm.

Additionally, measuring a laser beam's $M^2$ (second moment) or Beam Parameter Product, has traditionally been accomplished by scanning through the first three Rayleigh ranges of the focused beam using a pixelated camera, wherein the camera captures the spatial profile of the focused beam at intervals along the scan to measure the second moment beam diameter, pursuant with ISO 11146-1:2005 requirements. ISO 11146-1:2005 specifies methods for measuring beam widths (diameter), divergence angles and beam propagation ratios of laser beams and is applicable to general astigmatic beams or unknown types of beams. In accordance with ISO 11146-2:2005, the description of laser beams is accomplished by means of the second order moments of the Wigner distribution.

The ISO 11146-2:2005 requirement specifies no fewer than five spatial time slices within the first Rayleigh range and no fewer than five spatial time slices beyond the second Rayleigh range. However, the intensity of the focused beam in the third Rayleigh range drops by more than a factor of ten, when compared to the intensity of the focused beam in the first Rayleigh range. The signal-to-noise ratio of laser beam measurement sensors currently known in the art are not sensitive enough to accommodate this greater than a factor of ten intensity change in the third Rayleigh range. As such, the measurements of the beam in the third Rayleigh range taken by the known measurement systems are too close to the noise level of the sensor, thereby rendering the sensor unable to accurately measure the laser beam.

There are systems known in the art that attempt to address the signal-to-noise ratio problem, while also meeting the ISO requirement of having no fewer than five spatial time slices beyond the second Rayleigh range. One known system solves the signal-to-noise ratio issue by splitting the laser beam and then attenuating one of the beams so that the spatial time slots of the first and third Rayleigh range are of the same order of magnitude. While this method is effective, the cost of the system and the opto-mechanical complexity required are significantly increased. Another known system utilizes two separate cameras, wherein one camera is used to measure the first Rayleigh range and a second camera is used to measure the spots in the third Rayleigh range. While this is an acceptable, and widely utilized method, the cost is nearly twice that of a system having a single camera and the size of the overall system is more than doubled, making this an undesirable solution.

Accordingly, there is a need in the art for an apparatus and method for measuring a laser beam that meets the ISO requirements beyond the second Rayleigh range, but which does not increase the size of the instrument and does not significantly add to the cost of the instrument.

However, in view of the art considered as a whole at the time the present invention was made, it was not obvious to those of ordinary skill in the art how the limitations of the art could be overcome.

SUMMARY OF THE INVENTION

The present invention provides a method and apparatus for improving measurements of a laser beam in a laser imaging system. In various embodiments, an apodizing filter having a transmission profile that approaches a maximum at its edges is positioned between a pixelated detector and a laser source. A laser beam from the laser source is emitted onto the apodizing filter and a portion of the laser incident upon the apodizing filter is transmitted to the pixelated detector in accordance with the transmission profile of the apodizing filter such that the signal-to-noise ratio of the portion of the laser incident upon the pixelated detector is improved. The apodizing filter may be selected from a linear apodizing filter, a radial apodizing filter and a prism apodizing.

In one embodiment, the present invention provides a method for measuring a laser beam in a laser imaging system which includes, positioning an apodizing filter between a pixelated detector and a laser source, wherein the apodizing filter has a transmission profile that approaches a maximum at its edges, emitting a laser beam, from the laser source, onto the apodizing filter and transmitting at least a portion of laser beam through the apodizing filter to the pixelated detector based upon the transmission profile of the apodizing filter.

In a particular embodiment, the transmission profile of the apodizing filter is about 10 times less at a center of the apodizing filter than at the edges of the apodizing filter.

In one embodiment the apodizing filter is a linear apodizing filter comprising an absorbing glass substrate and a metal coating deposited on the substrate, wherein the pattern of the metal coating establishes the transmission profile of the apodizing filter that approaches a maximum at the edges of the substrate.

In another embodiment, the apodizing filter is a radial apodizing filter comprising a cylindrical plano-concave lens and a cylindrical plano-convex lens fabricated from an absorbing glass and optically bonded to the cylindrical piano-concave lens. In this embodiment, the cylindrical piano-concave lens and the cylindrical piano-convex lens have substantially the same radius of curvature, an index of refraction of the cylindrical plano-convex lens and an index of refraction of the cylindrical plano-concave lens are substantially equal and the radius of curvature establishes the transmission profile of the radial apodizing filter.

In an additional embodiment, the apodizing filter is a prism apodizing filter comprising a first triangular prism fabricated of an absorbing glass, a second triangular prism fabricated of a substantially transparent glass and a third triangular prism fabricated of a substantially transparent glass. In this embodiment, a lateral face of the second triangular prism is optically bonded to a first lateral face of the first triangular prism and a lateral face of the second triangular prism is optically bonded to a second lateral face of the second triangular prism and wherein dimensions of the second triangular prism and the third triangular prism are substantially equal and dimensions of the first triangular prism are approximately twice those of the second triangular prism and the third triangular prism. The index of refraction of the three prisms comprising the apodizing filter are substantially equal and the geometric configuration and composition of the triangular prisms establishes the transmission profile of the prism apodizing filter.

The configurations and composition of the apodizing filters of the present invention may also be effective in reducing ghost reflections at the pixelated detector.

The present invention additional provides an apparatus for measuring a laser beam in a laser imaging system which includes, a laser source to emit a laser beam, a pixelated detector to analyze the laser beam emitted from the laser source, and an apodizing filter positioned between the pixelated detector and the laser source, wherein the apodizing filter has a transmission profile that approaches a maximum at its edges. In this embodiment, the apodizing filter may be a linear apodizing filter, a radial apodizing filter or a prism apodizing filter.

These and other important objects, advantages, and features of the invention will become clear as this description proceeds.

The invention accordingly comprises the features of construction, combination of elements, and arrangement of parts that will be exemplified in the description set forth hereinafter and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE INVENTION

Figure 1:
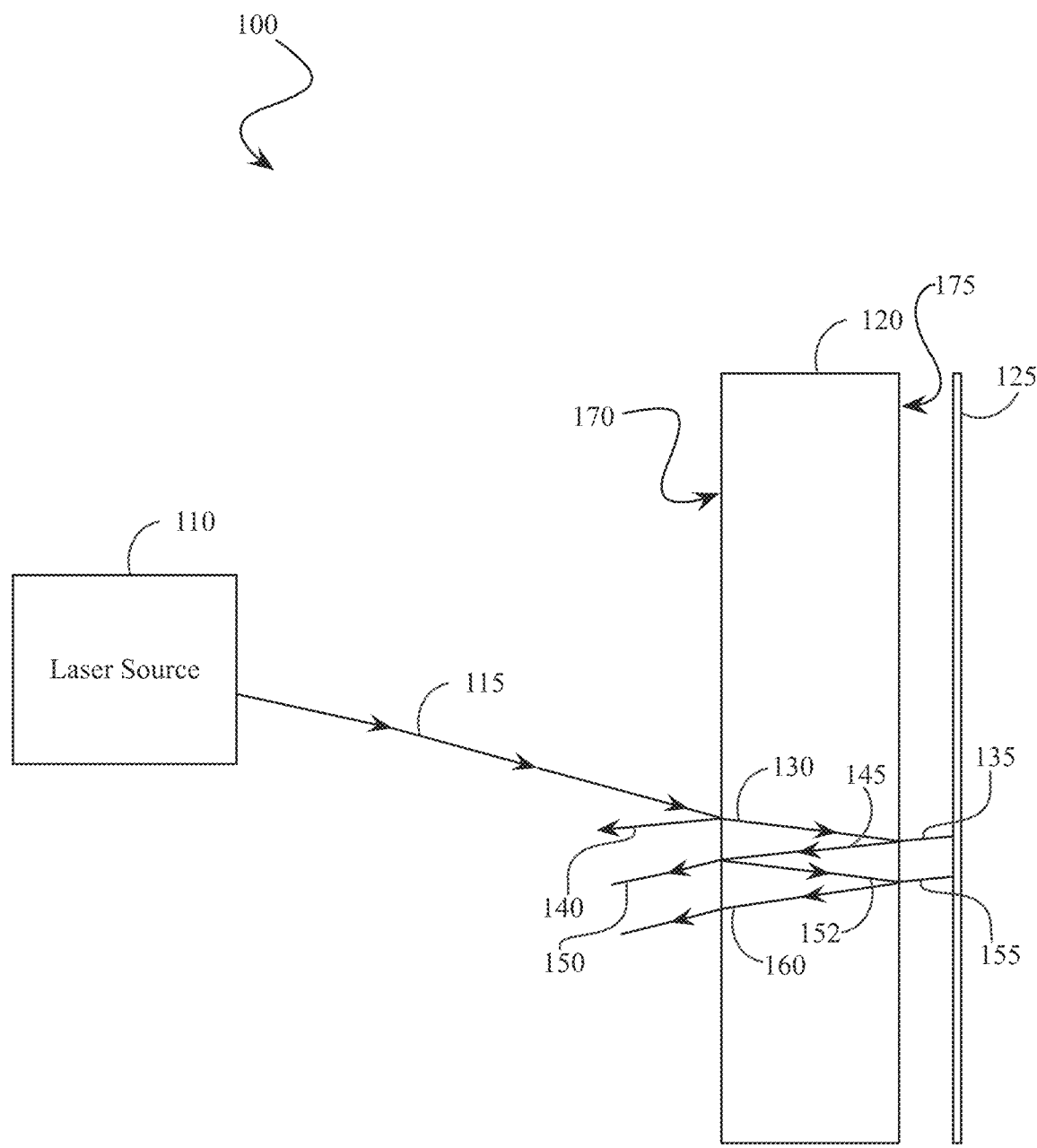
FIG. 1 is a diagram illustrating a laser imaging system having a protective glass window and associated ghost image at a pixelated detector, as is known in the prior art.

In one embodiment, the present invention provides a method and apparatus for reducing ghost images in a laser imaging system. In another embodiment, the present invention also provides a system and method for increasing the beam intensity in a laser imaging system to improve the ability of the laser imaging system to measure the laser beam.

In an exemplary embodiment for reducing ghost images in a laser imaging system, the method includes, positioning an absorptive neutral density filter, having an optical density (OD) of at least −1, between a pixelated detector and a laser source. The method further includes, emitting a laser beam, from the laser source onto the absorptive neutral density filter, transmitting a portion of the light incident upon a first surface of the absorptive neutral density filter to a second surface of the absorptive neutral density filter, reflecting a portion of light incident upon the second surface of the absorptive neutral density filter and absorbing the reflected portion of light, by the absorptive neutral density filter, to reduce ghost images at the pixelated detector.

Fresnel reflections in optics are a proportional reflection of incident light at a discrete interface between two optical media, wherein the two optical media have dissimilar indices of refraction, such as air and glass. A common Fresnel reflection, for predominately normal angle of incidence (<10 degrees), that occurs at an air-glass interface results in a proportional reflection loss of about 4%, due to the difference between the index of refraction of air and the index of refraction of glass. This reflection loss can be reduced by layering optical media between the glass and air interface to gradually reduce the index of refraction differential between the intermediate layers, thereby reducing the reflection loss to levels well below 0.5%, but generally not below 0.10%, except for very high-quality single "V" type coatings. Fresnel reflections are based upon the following equation:

$$R = \frac{(n_1 - n_2)^2}{(n_1 + n_2)^2}$$

Where, R is the percent reflection between the first optical media, having an index of refraction of $n_1$, and the second optical media, having an index of refraction of $n_2$. In an exemplary embodiment, if the first optical media is air, having an index of refraction equal to 1.00029 ($n_1$), and the second optical media is glass, having an index of refraction equal to 1.5 ($n_2$), then the percentage of light reflected from the air-glass interface will be about 4%. As there are finite glass materials available to mitigate the Fresnel reflection, it follows that one cannot achieve near zero reflection losses between an air and glass interface.

The transmitted power for a predominately normal incident laser beam between two optical media would be determined by:

$$T = \frac{4n_1 n_2}{[n_1 + n_2]^2}$$

As the angle of incidence increases, the influence of polarization begins to impact the amount of reflected and transmitted light by the following equations:

$$t_s = \frac{2n_1 \cos\theta_1}{n_1 \cos\theta_1 + n_2 \cos\theta_2}$$

$$r_s = \frac{n_1 \cos\theta_1 - n_2 \cos\theta_2}{n_1 \cos\theta_1 + n_2 \cos\theta_2}$$

$$t_p = \frac{2n_1 \cos\theta_1}{n_1 \cos\theta_2 + n_2 \cos\theta_1}$$

$$r_p = \frac{n_1 \cos\theta_2 - n_2 \cos\theta_1}{n_1 \cos\theta_2 + n_2 \cos\theta_1}$$

Where $t_s$ and $r_s$ are the transmitted and reflected light values for the "S" polarized component and $t_p$ and $r_p$ are the transmitted and reflected light values for the "P" polarized component.

In order to reduce reflection losses at air-glass interfaces, an antireflection coating is commonly used to prevent secondary reflections, or "ghost" reflections, that may obstruct the viewing of an object of interest by a human eye or a camera. While antireflection coatings are effective in reducing ghost reflections in these scenarios, many imaging systems exist that are much more sensitive to ghost reflections than the human eye, such as Charged Coupled Device (CCD), Complementary Metal-Oxide-Semiconductor (CMOS), InGaAs (Indium Gallium Arsenide) for the SWIR light band, InSb (Indium Antionide) for the MWIR light band and microbolometers for the LWIR light band digital cameras and digital imaging systems. CCD and CMOS digital imaging systems commonly include a pixelated detector, which comprises an array of light-sensing pixels to convert incoming photons into electronic charges at the semiconductor-oxide interface of the detector. Fresnel reflections occurring in these highly sensitive imaging systems can obscure an image or negatively impact a measurement taken by the imaging system in which they are employed.

Additionally, imaging systems utilizing pixelated detectors are commonly made from semiconductor materials using lithography-based circuitry manufacturing. The resulting circuitry from this manufacturing process is extremely delicate and easily damaged. Such pixelated detector-based imaging systems typically include a protective glass window to protect the fragile circuitry from damage. However, the use of a protective glass window introduces an air-glass interface between the protective glass window and the detector. As previously discussed, the air-glass interface introduced into the imaging system by the protective glass window results in undesirable Fresnel reflections, which are referred to here as ghost reflections.

In some imaging systems, the protective glass window used to protect the delicate circuitry may be an uncoated glass substrate in the visible portion of the optical spectrum. In other imaging systems, such as Short-Wave Infrared (SWIR), Mid-Wave Infrared (MWIR) and Long-Wave Infrared (LWIR) detectors, a protective glass window appropriate for the wavelength band on interest may be used. In the case of CCD and CMOS sensors, where the wavelength band may be from the Ultra Violet (UV) to the Near Infrared (NIR) (from 190 nm to more than 1100 nm), a UV grade fused silica protective glass window may be employed in the imaging system. Considering the very broad range of wavelengths that are possible in CCD and CMOS based imaging systems, it is extremely difficult to apply an interface coating on the protective glass window that would be effective in reducing the Fresnel reflections over this broad wavelength range. As such, most sensors used over this band have their protective window removed to avoid the Fresnel reflection losses and associated ghost reflections that can obscure the sensors measurement ability.

With reference to FIG. 1, a prior art imaging system 100 may include a laser source 110, a protective glass window 120 and a pixelated detector 125. In the prior art, the protective glass window 120 is positioned between the laser source 110 and the sensor material of the pixelated detector 125 to protect the sensing circuitry of the pixelated detector 125.

In operation of the prior art imaging system 100, a laser beam 115 emitted from the laser source 110 passes through the air and strikes the first surface 170 of the protective glass window 120. A first Fresnel reflection occurs at this air-glass interface, wherein a first transmitted portion 130 of the light from the laser beam is transmitted through the protective glass window 120, and a first reflected portion 140 of the light is reflected. The transmitted portion 130 then strikes the second surface 175 of the protective glass window 120 and a second Fresnel reflection occurs at this glass-air interface, wherein a second transmitted portion 135 of the light is transmitted through the air, striking the pixelated detector 125, and a second reflected portion 145 of the light is reflected. This second reflected portion of light 145 strikes the first surface 170 again, resulting in a third transmitted portion 150 of light that enters the air and a third reflected portion 152 of light that is transmitted back through the protective glass window 120. This third reflected portion 152 of light experiences another Fresnel reflection at the air interface between the protective glass window 120 and the pixelated detector 125, resulting in a forth transmitted portion 155 of light striking the pixelated detector 125 and a forth reflected portion 160 of light being reflected through the protective glass window 120. The forth transmitted portion 155 of light striking the pixelated detector 120 results in a ghost image at the pixelated detector 125. In general, as illustrated in FIG. 1, each optical medium interface that the incident laser beam 115 crosses causes some portion of the incident light to be reflected, thereby creating a ghost image of the incident beam on the pixelated detector. The ghost image of the incident laser beam 115 is undesirable because, a typical laser beam can be both highly longitudinally and spatially coherent, the Fresnel reflection and associated ghost image causes destructive and constructive interference fringes. The resulting spatial modulation on the beam would be noise, which would obscure the true spatial profile of the laser beam.

Figure 2:
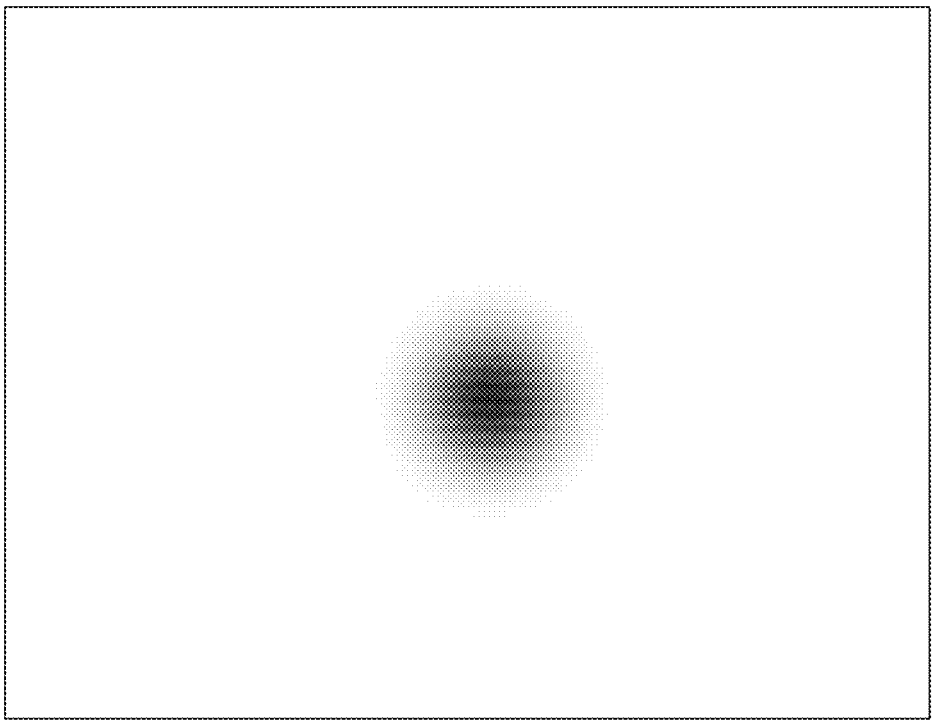
FIG. 2 is an illustration of the resulting interference fringes from ghost images resulting from Fresnel reflections with coherent laser light on a pixelated detector, as is known in the prior art.

FIG. 2 illustrates a gray scale 3D intensity of a ghost image resulting from a coherent laser beam having a nominal 1 mm beam diameter and a wavelength of 532 nm that is detected by a pixelated detector (2048×1088 pixels) having a protective glass window. As can be seen, while the reflected light of the laser beam is only about 4% of the emitted laser beam, the constructive and destructive interference resulting from the ghost image is quite pronounced and would severely impact the ability of the pixelated detector to make accurate laser beam measurements.

In various embodiments, the present invention provides a system and method for mitigating ghost reflections due to Fresnel reflection losses in imaging systems utilizing pixelated detectors, such as, but not limited to CCD, CMOS, InGaAs, InSb and microbolometer sensors.

In one embodiment, the present invention provides an improved protective window for a pixelated detector of an imaging system that does not introduce the adverse effects of Fresnel reflections and ghost reflections. The improved protective window provides protection for the sensitive circuitry of the laser imaging system without introducing ghost reflections into the measurement of the laser.

Figure 3:
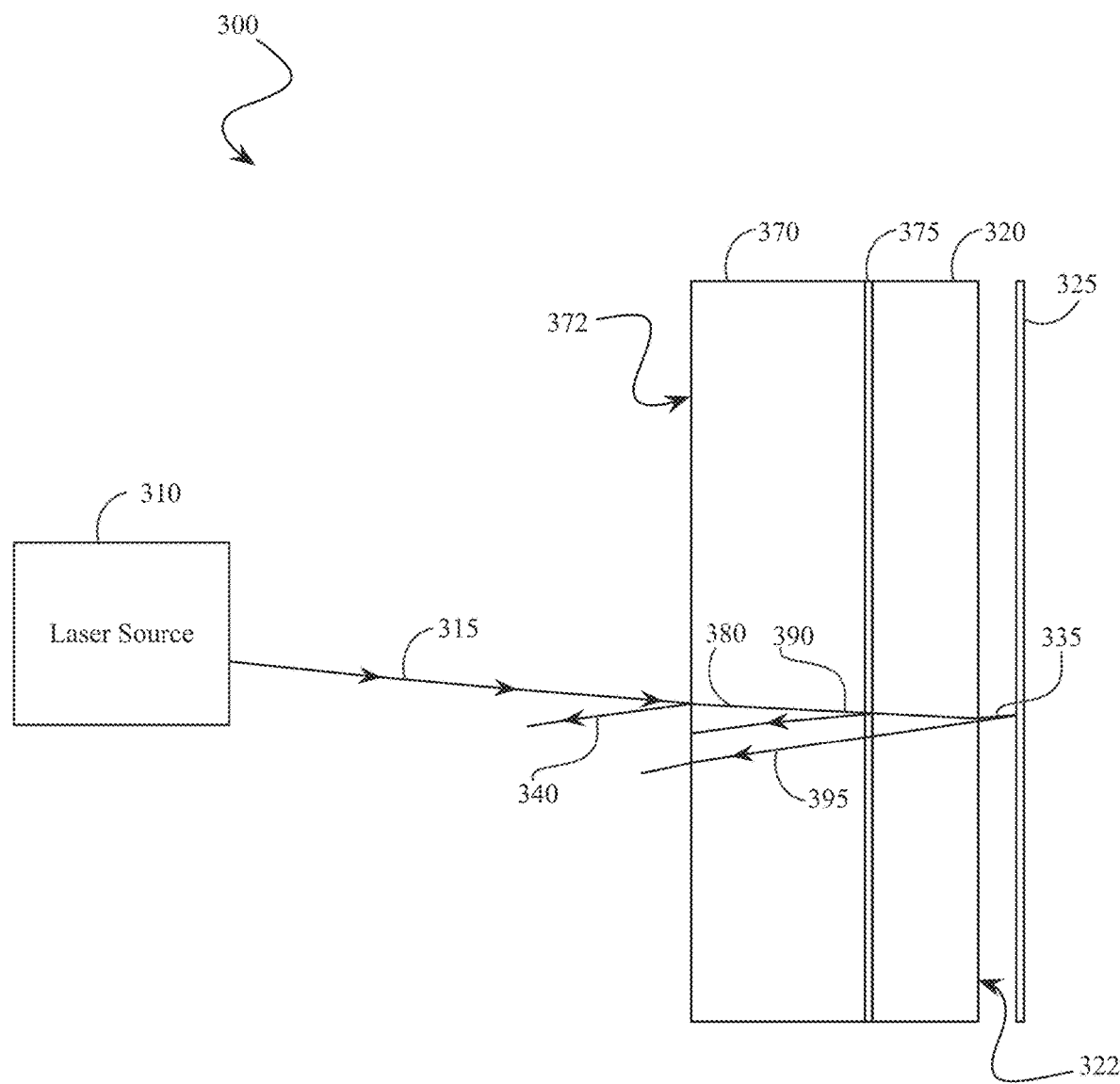
FIG. 3 illustrates a laser imaging system incorporating an absorptive neutral density filter optically connected to the protective glass window to reduce ghost images, in accordance with an embodiment of the present invention.

With reference to FIG. 3, in one embodiment, an imaging system of the present invention 300 may include a laser source 310, a protective glass window 320, a pixelated detector 325 and an absorptive neutral density filter 370 optically connected to the protective glass window 320.

The laser source 310 may be one of numerous laser sources known in the art. Commercially available lasers having powers from nanowatts to multikilowatts are within the scope of the present invention. In a particular embodiment, the laser source 310 is capable of emitting a laser beam that can be both longitudinally and spatially coherent.

The protective glass window 320 may be an uncoated glass substrate for the visible portion of the optical spectrum. Alternatively, the protective glass window may be a coated glass window appropriate for the wavelength band related to the laser source 310. The surface of the protective glass window facing the pixelated detector 325 includes an anti-reflective coating 322. The protective glass window 320 is generally positioned to protect the delicate circuitry of the pixelated detector 325 from physical damage.

The pixelated detector 325 may be one of many pixelated detectors known in the art, including but not limited, to Charge-Coupled Device (CCD) and Complementary Metal Oxide Semiconductor (CMOS) or other pixilated detector. The pixelated detector 325 is configured to analyze the laser beam emitted from the laser source 310. The analysis may include various measurements, such as, but not limited to, the spatial profile, centroid, and ellipticity of the laser beam.

The absorptive neutral density filter 370 of the present invention attenuates incident radiation uniformly independent of wavelength, i.e. neutral with respect to wavelength. The absorptive neutral density filter 370 is characterized by the percent of incident light transmitted or by its optical density (OD). If 10% of light is transmitted (T=0.1), the filter is said to have an OD equal to −1. At T=0.01, the filter is said to have an OD equal to −2 and at T=0.001 the filter is said to have an OD equal to −3. In general, OD=−log 10(T).

The absorptive neutral density filter 370 may be fabricated from various absorptive glass substrates known in the art. For example, the absorptive neutral density filter 370 may be fabricated from one of a variety of Schott® NG-rated glass or Hoya® ND-rated glass, or any other glass having an almost constant attenuation inside the visible spectrum. It would be obvious to those skilled in the art that any "absorbing" glass with an OD~−1.0 is within the scope of the present invention.

In this embodiment of the present invention, the absorptive neutral density filter 370 includes a first surface 372 facing the laser source 310 and a second surface 374 facing the pixelated detector 325. Additionally, the second surface 374 of the absorptive neutral density filter 370 is in optical contact with the protective glass window 320. In this embodiment, a first surface of the protective glass window 320 is in optical contact with the second surface 374 of the absorptive neutral density filter 370 and a second surface of the protective glass window 320 includes an anti-reflective coating 322. The protective glass window 320 is positioned in close proximity to the pixelated detector 325. In a particular embodiment, the protective glass window 320 is positioned to be less than about 5 mm from the pixelated detector 325.

In one embodiment, the protective glass window 320 in positioned in optical contact with the second surface 374 of the absorptive neutral density filter 370 by bonding a surface of the protective glass window 320 to the second surface 374 of the absorptive neutral density filter 370 using optical glue or adhesive having a refractive index that substantially matches the refractive index of the absorptive neutral density filter 370 and the protective glass window 320. A wide variety of adhesives 375 may be used for optical bonding, including well known optical adhesives from Norland Products®, silicone, optical epoxy, and polyurethane. One of the objectives of optical bonding is to remove the air gap between the absorptive neutral density filter 370 and the protective glass windows 320, using the optical-grade adhesive 175. In general, the difference between the refractive index of the bonding material and the refractive index of both the absorptive neutral density filter 370 and the protective glass window 320 the should be less than about 20%.

In an additional embodiment, the optical contact between the absorptive neutral density filter 370 and the protective glass window 320 may be accomplished through atomic bonding. Atomic bonding is a glueless process whereby two closely conformal surfaces are held together purely by intermolecular forces. To accomplish atomic bonding, the absorptive neutral density filter 370 and the protective glass window 320 would need to be very well polished and be exposed to minimal thermal cycling.

In one exemplary embodiment of FIG. 3, the absorptive neutral density filter 370 may be made from Schott® NG4 glass material of a nominal thickness of 1.9 mm and an index of refraction of about 1.51 at a laser beam wavelength of about 532 nm. The protective glass window 320 may be a 1 mm thick protective glass cover of a pixelated detector 325 having an index of refraction of about 1.52 at a laser beam wavelength of about 532 nm. The absorptive neutral density filter 370 may be optically attached to the protective glass window 320 by an index matching glue having a nominal index of refraction equal to about 1.56, such as Norland Products® NOA 61.

In operation of the laser imaging system 300 of FIG. 3, a laser beam 315 from the laser source 310 strikes the first surface 372 of the absorptive neutral density filter 370. Assuming the absorptive neutral density filter has an OD equal to about −1, in the visible band, the absorptive neutral density filter 370 attenuates the light from the laser beam 315 by about 90%. A portion of the light 340 from the laser beam 315 is also lost due to a Fresnel reflection at the air-glass interface between the laser source 310 and the absorptive neutral density filter 370. As such, about 10% of the light 380 is transmitted through the absorptive neutral density filter 370 and the protective glass window 320. The transmitted light 380 exits the protective glass window 320 and experiences a Fresnel reflection at the air-glass interface between the protective glass window 320 and the pixelated detector 325. The interface between the absorptive neutral density filter 370 and the optical bond 375 results in a small reflection of light 390. This reflected light 390 is a small value and becomes inconsequential due to the low reflection and the return reflection 390 is essentially fully absorbed by the neutral density filter 370 beyond the detection limits of the pixelated detector 325. The light 395 reflected by the air-glass interface between the protective glass window 320 and the pixelated detector 325 is reflected back through the protective glass window 320 and the absorptive neutral density filter 370. The reflected light 395 is then absorbed by the absorptive neutral density filter 370 and its impact on interference is mitigated beyond detection by the pixelated detector. Additionally, the anti-reflective coating on the second surface of the protective glass window 320 overcomes the destructive and constructive interference that occurs from the Fresnel reflections at the air-glass interface between the protective glass window 320 and the pixelated detector 325. While in the prior art, this reflected light 390 would result in a ghost image at the pixelated detector 325, in the present invention the absorptive neutral density filter 370 is effective in absorbing the reflected light 390 from the Fresnel reflection at the air-glass interface between the protective glass window 320 and the pixelated detector 325, thereby reducing the presence of the ghost image at the pixelated detector 325.

While only about 10% of the light from the laser beam 315, minus the approximately 4% Fresnel reflection 340, is transmitted as light 335 to the pixelated detector 325, most laser beams used in laser imaging systems need to be heavily attenuated before they can illuminate the sensor of the pixelated detector 325. Due to the substantial number of photons available from the laser beam 315 and the wide dynamic range of the sensor of the pixelated detector 325, the lost light is inconsequential to the operating of the laser imaging system 300.

In the present invention, while the ghost reflection 390 still exists, as a result of the Fresnel reflection at the air-glass interface between the protective glass window 320 and the pixelated detector 325, it is reflected back through the protective glass window 320 and the absorptive neutral density filter 370, thereby further attenuating the reflected light by another factor of 10. As such, the ghost Fresnel reflection is no less than $\frac{1}{100}^{th}$ of the light 335 incident upon the pixelated detector 325, which is far better than any anti-reflection coatings known in the art.

Additionally, it would be obvious to those skilled in the art that utilizing an even more absorptive glass in the absorptive neutral density filter 370 would further reduce the Fresnel reflections and associated ghost image of the laser imaging system 300. In general, any absorptive glass that provides an OD≤−1 for the wavelength being used is within the scope of the present invention.

Figure 4:
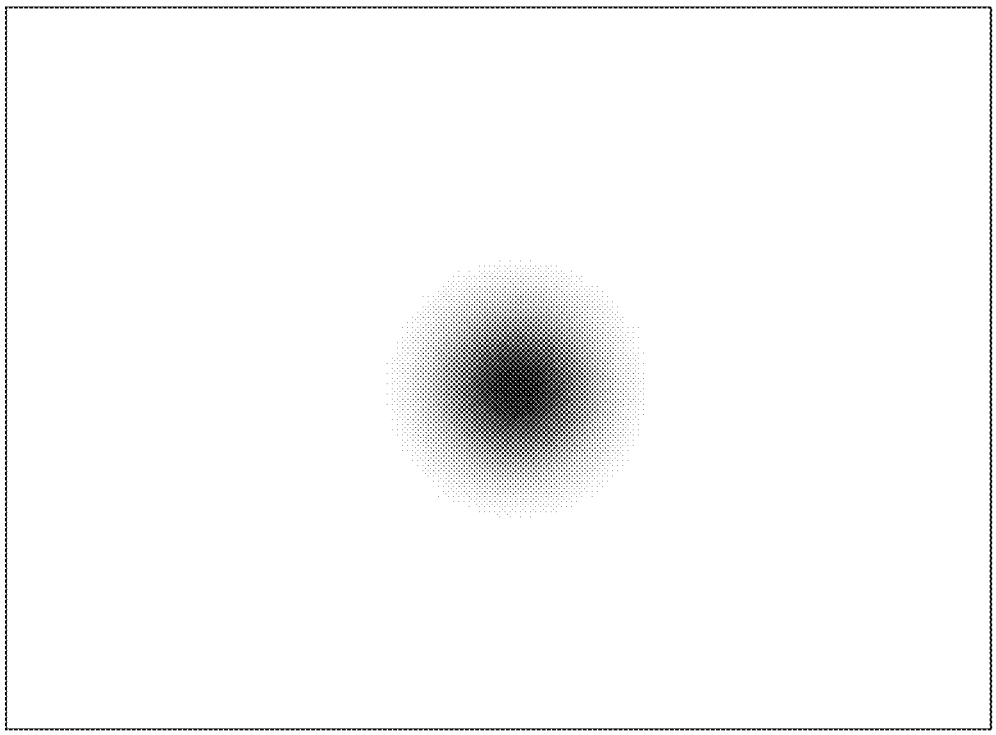
FIG. 4 illustrates the mitigated fringing effect realized by utilizing the improved laser imaging system of FIG. 3.

FIG. 4 illustrates the results when the laser imaging system 300 includes an absorptive neutral density filter 370 as shown in FIG. 3. It can be seen in FIG. 4 that there are no signs of fringing due to optical interference.

Accordingly, the embodiment of the present invention illustrated in FIG. 3 has the advantage of mitigating the ghost image to levels that cannot be detected by the pixelated detector. The absorptive neutral density filter also provides an additional optical attenuation of OD≤−1, which enables the pixelated detector to handle increased laser power by at least a factor of 10, in contrast to the current state of the art which is a windowless pixelated detector.

In an additional embodiment, instead of optically attaching the absorptive neutral density filter 370 to the protective glass window 320, the protective window of the pixelated detector may be completely replaced by the absorptive neutral density filter 370. The absorptive neutral density filter 370 may be installed in place of the protective glass window 320 during the production process of the pixelated detector, thereby eliminating the additional step of bonding the absorptive neutral density filter 370 to the protective glass window 320. In this embodiment, the absorptive neutral density filter 370 would be positioned in close proximity to the pixelated detector 325. In a particular embodiment, the absorptive neutral density filter 370 would be positioned less than about 5 mm from the pixelated detector 525.

Figure 5:
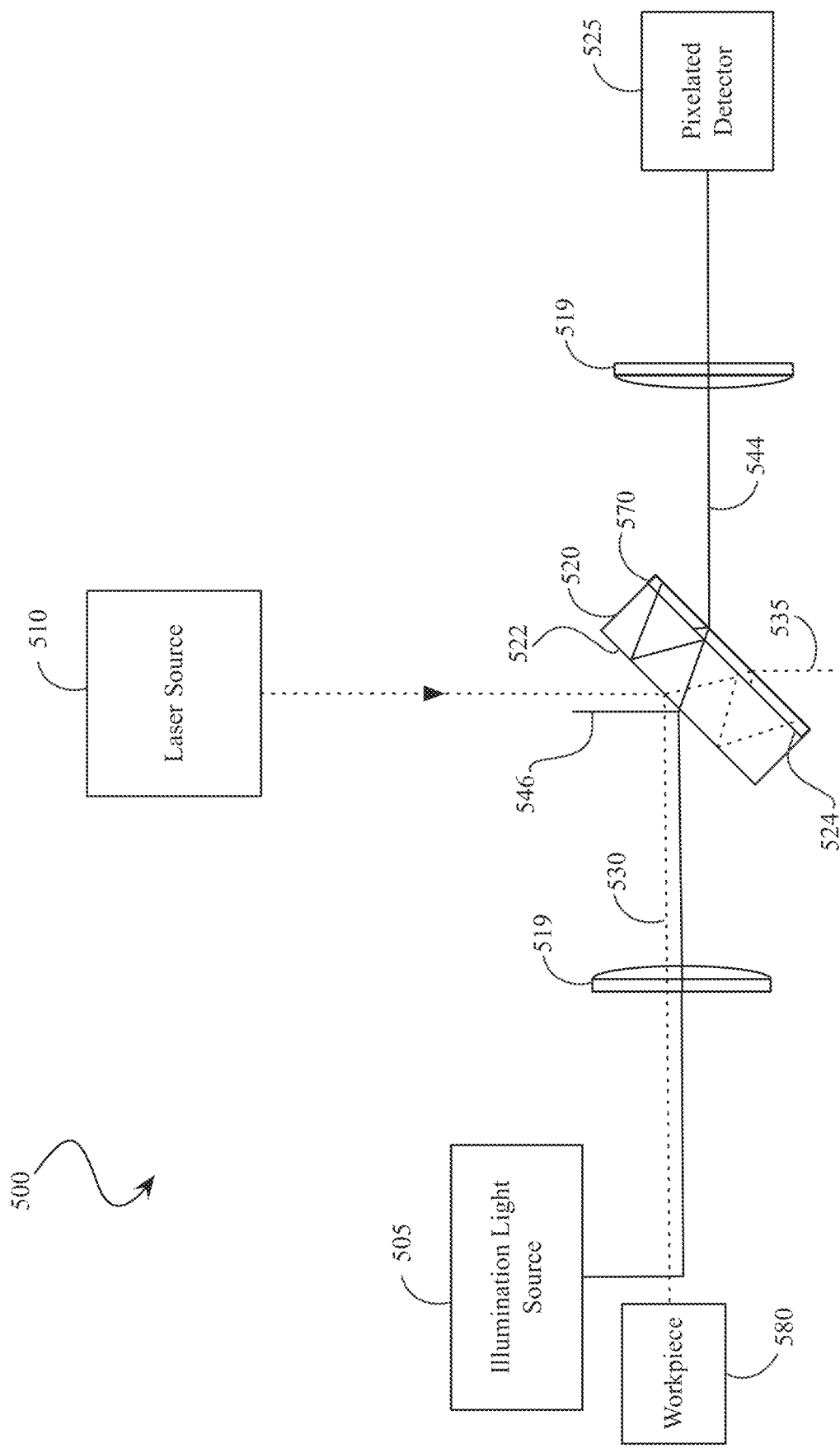
FIG. 5 illustrates a laser imaging system incorporating an absorptive neutral density filter optically connected to a laser bending mirror to reduce ghost images, in accordance with an embodiment of the present invention.

With reference to FIG. 5, in an additional embodiment of the present invention, ghost images may additionally be reduced in a laser imaging system 500, such as a laser used for material processing and a vision system that allows vision of the laser interaction area. In operation of this embodiment, a laser beam 515 from a laser source 510 is directed toward an optical element 520 having a mirror surface 522 that reflects the laser 530, while also transmitting visible light 535. As such, in this embodiment the optical element 520 may be referred to as a laser turning mirror because it redirects the laser 530 to the workpiece 580. In order to view the laser interaction area, a pixelated detector is included in the laser imaging system 500. In one embodiment, an illumination light 507 from an illumination light source 505 of the pixelated detector provides illumination light 507 for the material processing workpiece 580 that is subjected to the laser 530 from the laser source 510. Additional lens 519, 542 may be added to the laser imaging system 500 for focusing the laser light and the illumination light.

In an exemplary embodiment, a user of a laser machining system may be viewing the workpiece 580 being acted upon by the laser 530 in the material processing system by illuminating the workpiece with a light source 507. Commonly, the illumination light 507 from the pixelated detector 505 is white light or LED light. In this embodiment, due to the turning of the laser 515 by the turning mirror 520, the transmitted light 535 from the optical element 530 does not produce ghost images at the detector 525, however, the illumination light 507 from the illumination light source 505 may produce detectable ghost images.

In this embodiment, the illumination light 507 strikes the turning mirror 520, wherein some of the illumination light 546 is reflected off of the mirror surface and some of the illumination light 544 is transmitted through the turning mirror. Typically, the second surface 524 of a laser turning mirror 520 is uncoated, which would result in a ghost Fresnel reflection of the incident illumination light 507, due to the glass-air interface. While it is known that coating the second surface 524 of the laser tuning mirror 520 with an anti-reflective coating is relatively effective in reducing ghost images, the remaining ghost images may still be within the detection range of the pixelated detector 525.

In the present invention, an absorptive neutral density filter 570 is positioned to optically contact the surface of the laser tuning mirror 520 closest to the pixelated detector 525. As previously described, the absorptive neutral density filter 570 has a OD≤-1, thereby eliminating the need for an anti-reflective coating while also greatly reducing the ghost image incident upon the pixelated detector 525.

In general, as shown in the embodiment of FIG. 5, the addition of the absorptive neutral density filter 570 to the laser imaging system 500 greatly reduces the ghost images seen by the pixelated detector 525 resulting from the illumination light 507 from the pixelated detector, thereby improving the accuracy of the measurements taken by the pixelated detector 525.

Figure 6:
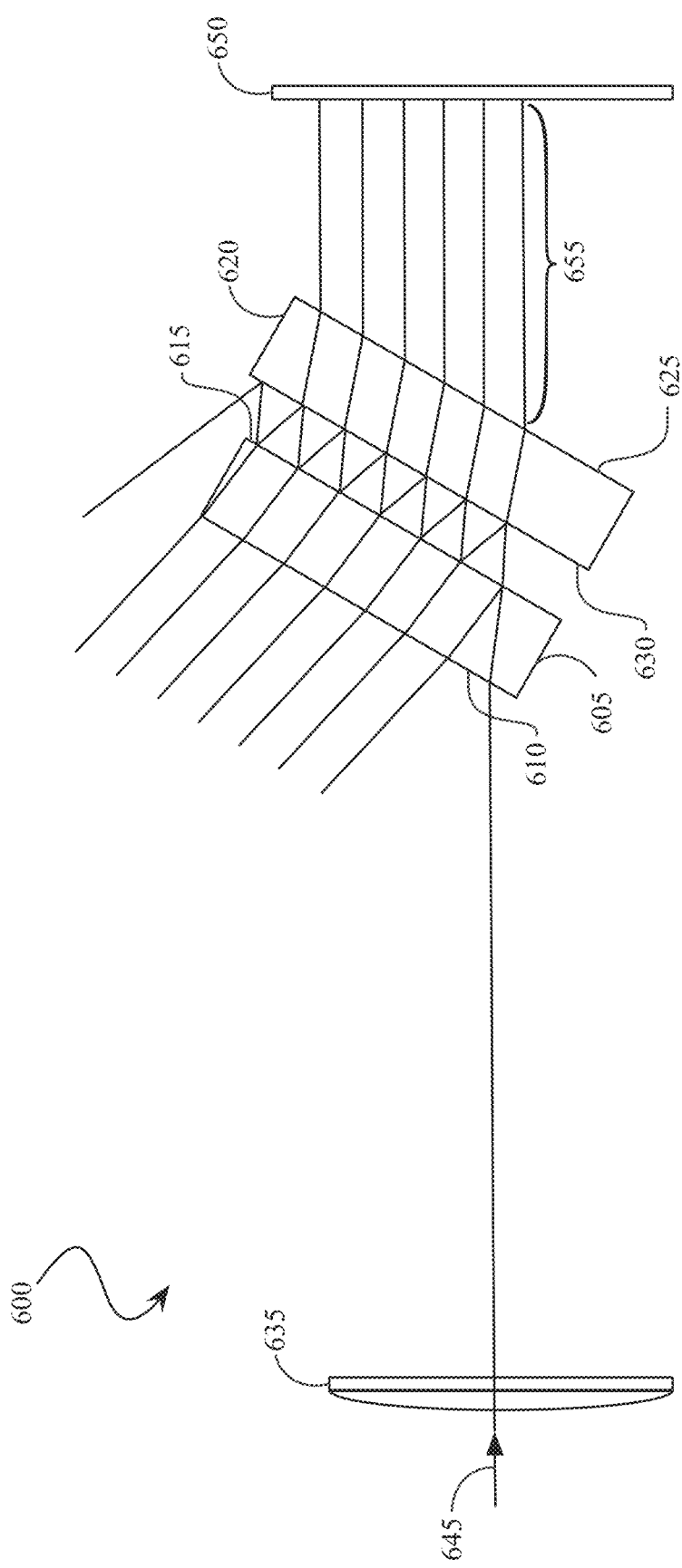
FIG. 6 illustrates a laser imaging system incorporating an absorptive neutral density filter into a Fabry-Perot cavity to reduce ghost images, in accordance with an embodiment of the present invention.

As shown with reference to FIG. 6, a laser imaging system 600 may include a pair of optical elements which are considered to be highly reflective mirrors 605, 620. The first mirror 605 is fabricated of highly transmissive glass suitable for the wavelength of the laser 645, such as fused silica (SiO$_2$), which has a high transmission from the ultraviolet through the near infrared region of the spectrum. The second mirror 620 is fabricated of an absorptive glass material, again suitable for the wavelength of the laser 645, such as an absorptive neutral density filter material. The first mirror 605 has a highly reflective surface 615 and an anti-reflective coated surface 610 and the second mirror 620 has a highly reflective surface 630 and an anti-reflective coated surface 625. The second mirror having an absorptive substrate, a highly reflective surface 630 and an anti-reflective coated surface 625 is considered in this embodiment to be an absorptive neutral density filter 620. In a particular embodiment, the highly reflective surfaces 615, 630 may be between about 98% and 99.9% reflective to the laser 645.

The first mirror 605, and the absorptive neutral density filter 620 are positioned downstream from a focusing lens 635 for focusing received laser beam 645. The first mirror 605, and the absorptive neutral density filter 620 have respective highly reflective surfaces 615, 630 facing each other, as shown in FIG. 6. The spacing between the mirrors 605, 620 is adjustable from a few microns to more than ten millimeters (10 mm).

In the embodiment of FIG. 6, the absorptive neutral density filter 620 may be further adjustable by a vertical and horizontal adjusting mount to align the first mirror 605, and the absorptive neutral density filter 620 so they are parallel to one another, thereby forming a Fabry-Perot resonator arrangement. In operation, the laser beam 645 is subjected to multiple reflections and associated splitting of the laser beam 645 within the Fabry-Perot resonator arrangement. As such, each subsequently transmitted beam 655 that is incident upon the pixelated detector 650 is about less than 1% less in intensity. If a nominally one watt of attenuated power from the laser 645 is focused by a lens 635 to be incident upon the first mirror 605 by passing first through the anti-reflective coated surface 610 and then, more than ninety nine percent (99%) of the laser light is reflected off the highly reflective surface 630 of the absorptive neutral density filter 620, and may be sent onto a simple beam dump (not shown). As such, the highly reflective surface 630 of the absorptive neutral density filter 620 is greater than 99% reflective and the anti-reflective coated surface 625 of the absorptive neutral density filter 620 is less than 0.5% reflective. Accordingly, as previously described, the absorptive neutral density filter 620 absorbs the light reflected back from the air-glass interface between the absorptive neutral density filter 620 and the pixelated detector 650, thereby reducing the ghost image seen by the pixelated detector.

In general, in the embodiment of FIG. 6, the absorptive neutral density filter 620 is effective in substantially reducing the ghost images seen by the pixelated detector. Additionally, the position of the absorptive neutral density filter 620 in the laser imaging system 600 can eliminate the need to place an absorptive filter between the optical elements 605, 620 and the pixelated detector, as is commonly known in the art.

Figure 7:
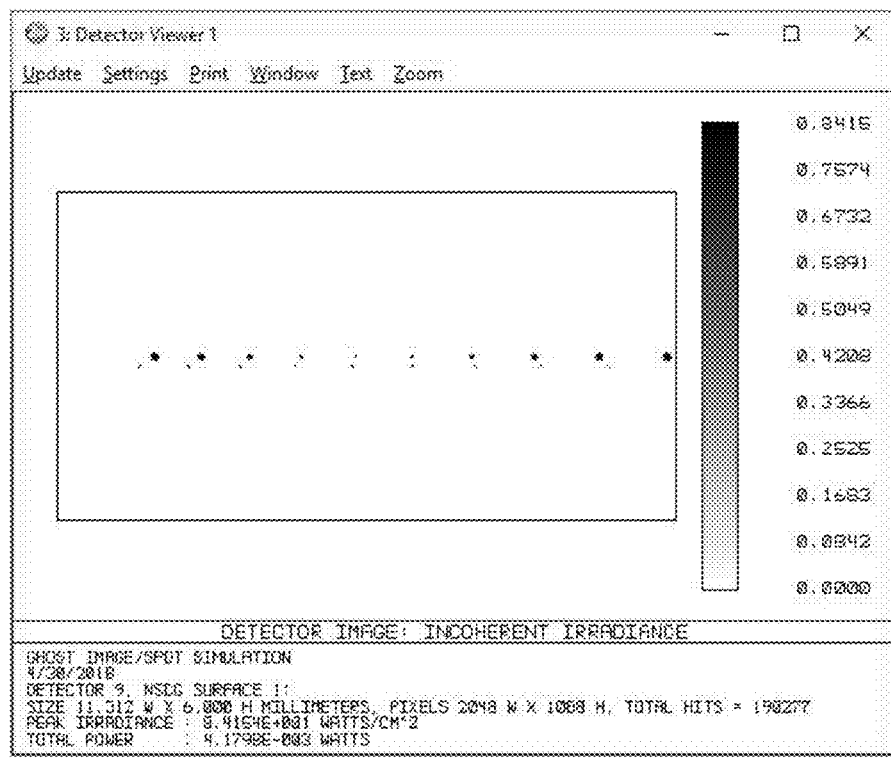
FIG. 7 illustrates the ghost images seen at a detector, as is known in the prior art.
Figure 8:
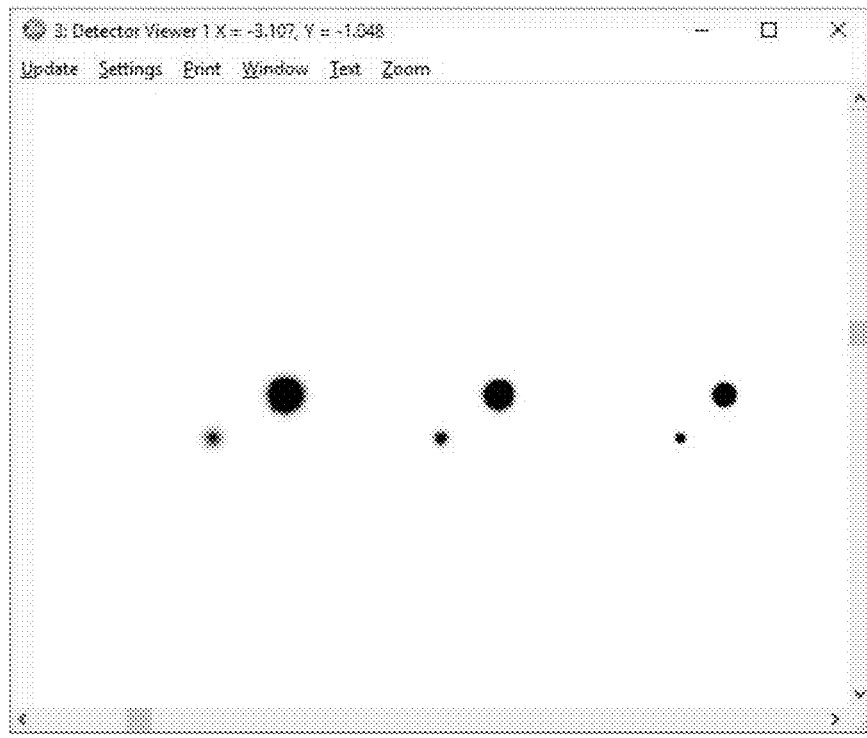
FIG. 8 is a zoomed view of FIG. 7.

FIG. 7 illustrates the basic phenomenon of a second surface ghost image or spot occurring at a pixelated detector as is known in the prior art. FIG. 8 is a zoomed image of FIG. 7, more clearly illustrating the transmitted beam and the ghost images present in the prior art.

Figure 9:
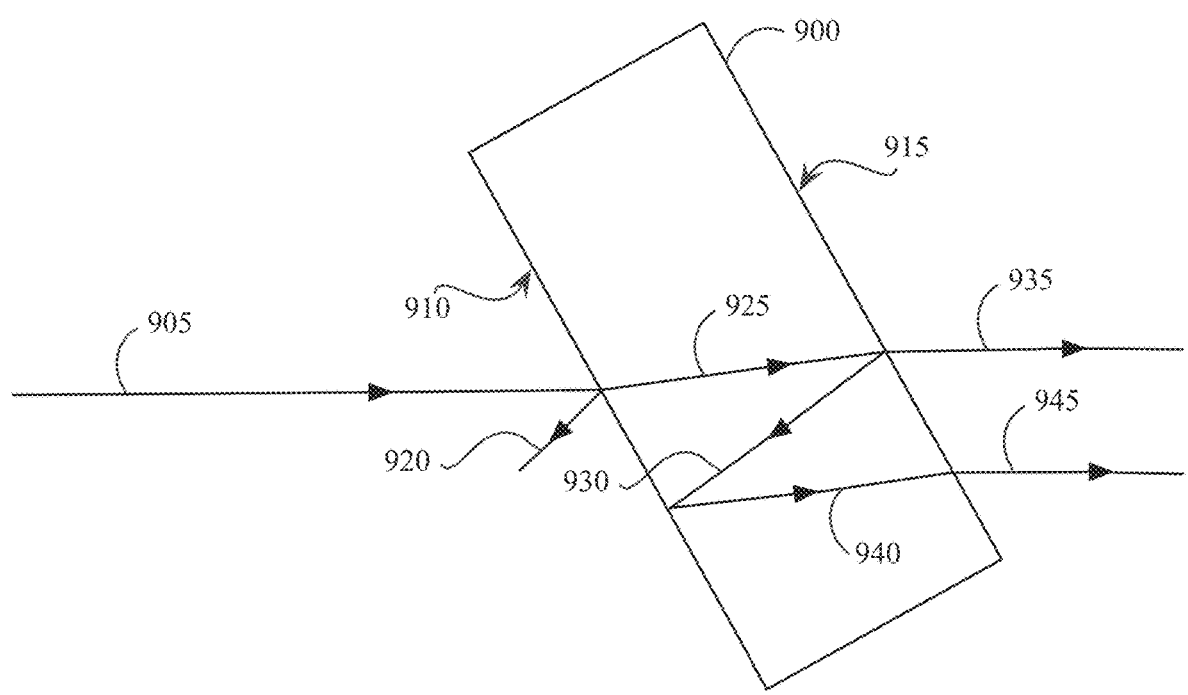
FIG. 9 illustrates a second surface reflection at an optical element producing ghost images of a transmitted laser beam at a detector, as is known in the prior art.

FIG. 9 illustrates how the ghost image is formed through an optical element 900 that is serving as both a reflective and transmissive optical element 900. In one embodiment, the optical element may be a substantially transmissive glass, such as SiO$_2$. In operation, a laser beam incident upon a first surface 910 of the optical element 900, enters the optical element 900 and, depending upon the specific coatings on the first surface 910 and the second surface 915, a portion of the light from the laser 905 is reflected 920 from the first surface 910 and a portion of the light from the laser 905 is transmitted 925 through the glass. The transmitted light 925 then impinges on the second surface 915, which is generally anti-reflection coated, such that typically less than 0.5% of the light is reflected back into the glass 930 and the remaining light passes through 935 and to be analyzed by the detector. This less than 0.5% of reflected light 930 then impinges again on the first surface 910 of the optical element 900 and is then reflected back 940 towards the second surface 910, thereby resulting in a ghost image 945 at the detector. It is this ghost image 945 that interferes with the measurement system at the detector.

Figure 10:
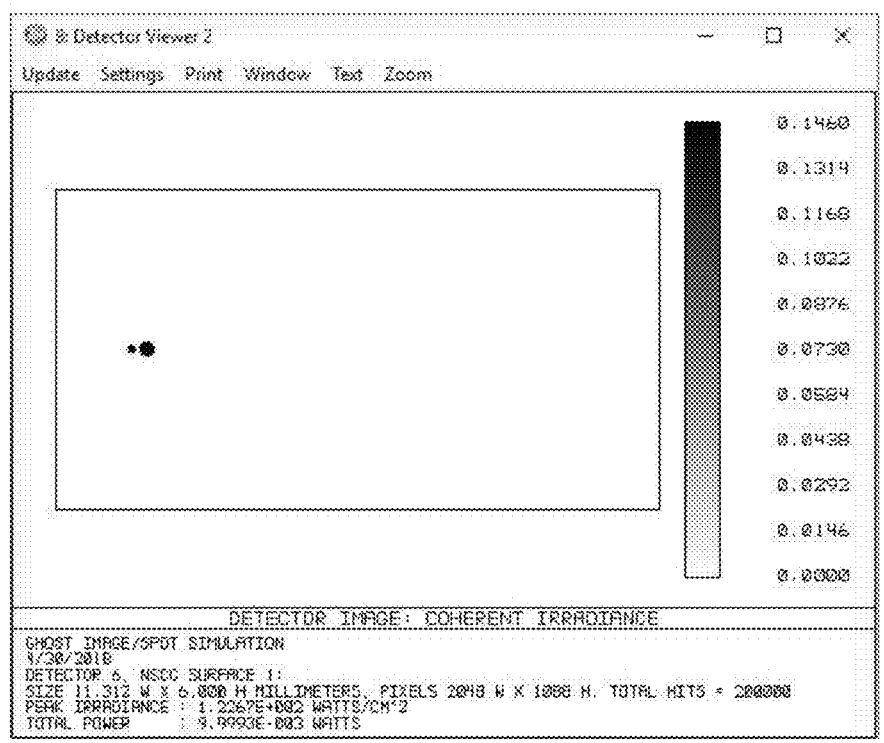
FIG. 10 illustrates the ghost images resulting from the reflections at the optical element of FIG. 9.
Figure 11:
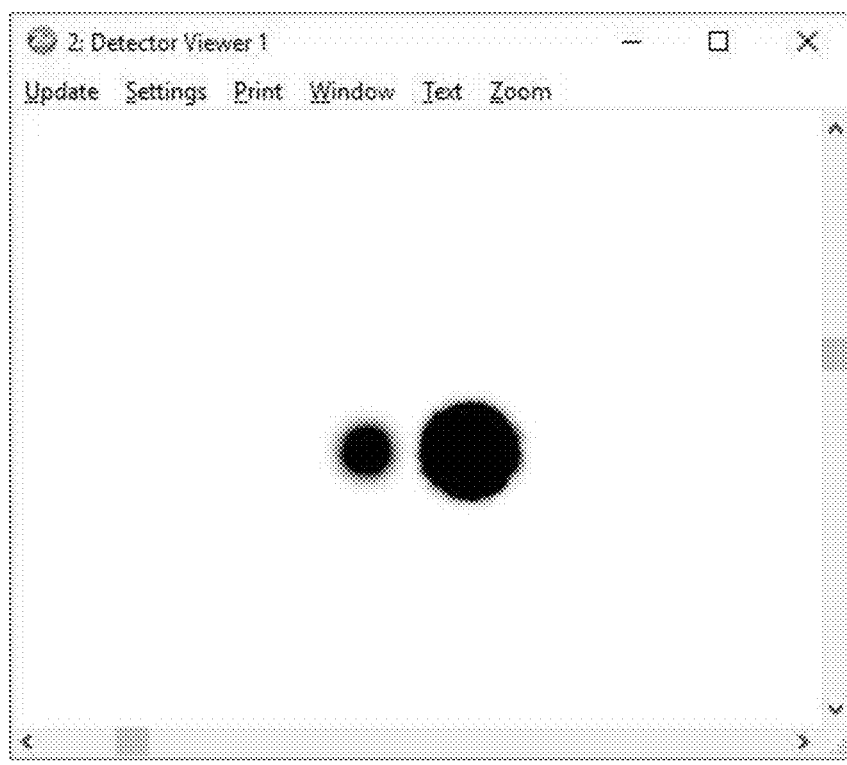
FIG. 11 is a zoomed view of FIG. 10.

FIG. 10 illustrates a detector simulation of the ghost image, showing the transmitted beam and the second surface ghost image that would occur utilizing the optical element 900 shown in FIG. 9 in a laser imaging system. FIG. 11 illustrates a zoomed view of the two beams of FIG. 10, including the desired transmitted beam and the undesired ghost image.

Figure 12:
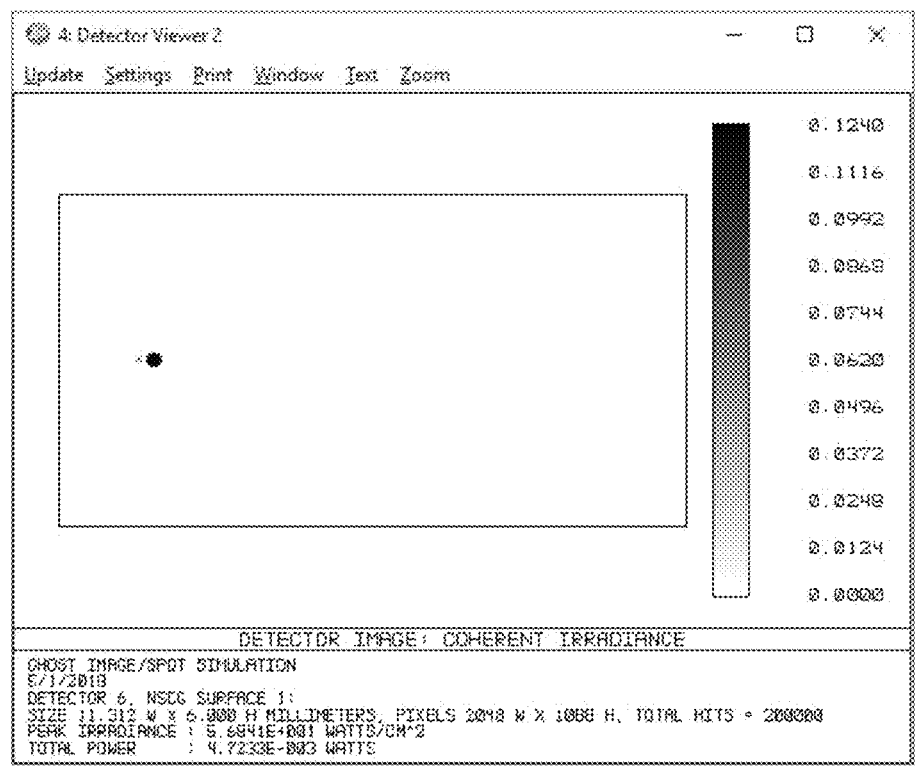
FIG. 12 illustrates the reduced ghost images observed when incorporating the absorptive neutral density filter into the laser imaging system, in accordance with an embodiment of the present invention.
Figure 13:
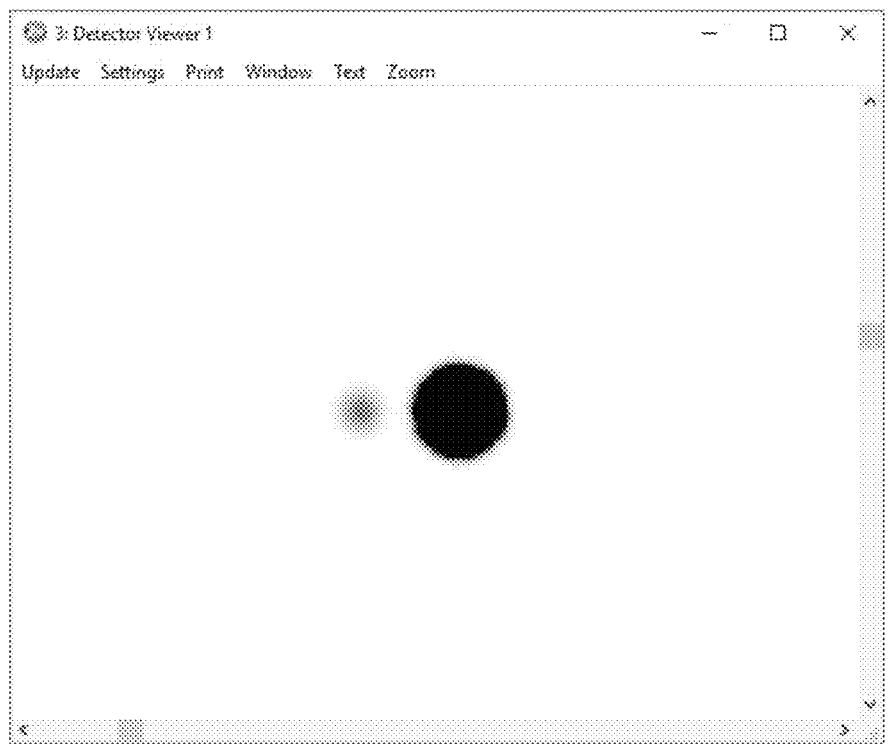
FIG. 13 is a zoomed view of FIG. 12.

FIG. 12 illustrates a detector simulation wherein the $SiO_2$ glass of the optical element 900 of FIG. 9 is replaced by Schott® NG11 absorbing filter glass, in accordance with the embodiments of the present invention. FIG. 13 illustrates a zoomed view of the resulting transmitted beam and ghost image of FIG. 12. As can be seen in FIG. 13, the embodiments of the present invention are effective in greatly reducing the ghost image at the detector. The simulation shown a greater than 10 times reduction in the ghost image intensity. As such, utilizing NG11 glass in the optical element 900, even with a similar anti-reflection coating on the second surface, the net second surface reflection would be reduced from less than 0.5% to less than 0.05%. Such a reduction in the ghost image intensity would not be noticeably detected by the pixelated detector, in contrast to the transmitted beam, and would fall within the noise of the pixelated detector, thereby improving the ability of the pixelated detector to accurately analyze the laser beam.

Figure 14:
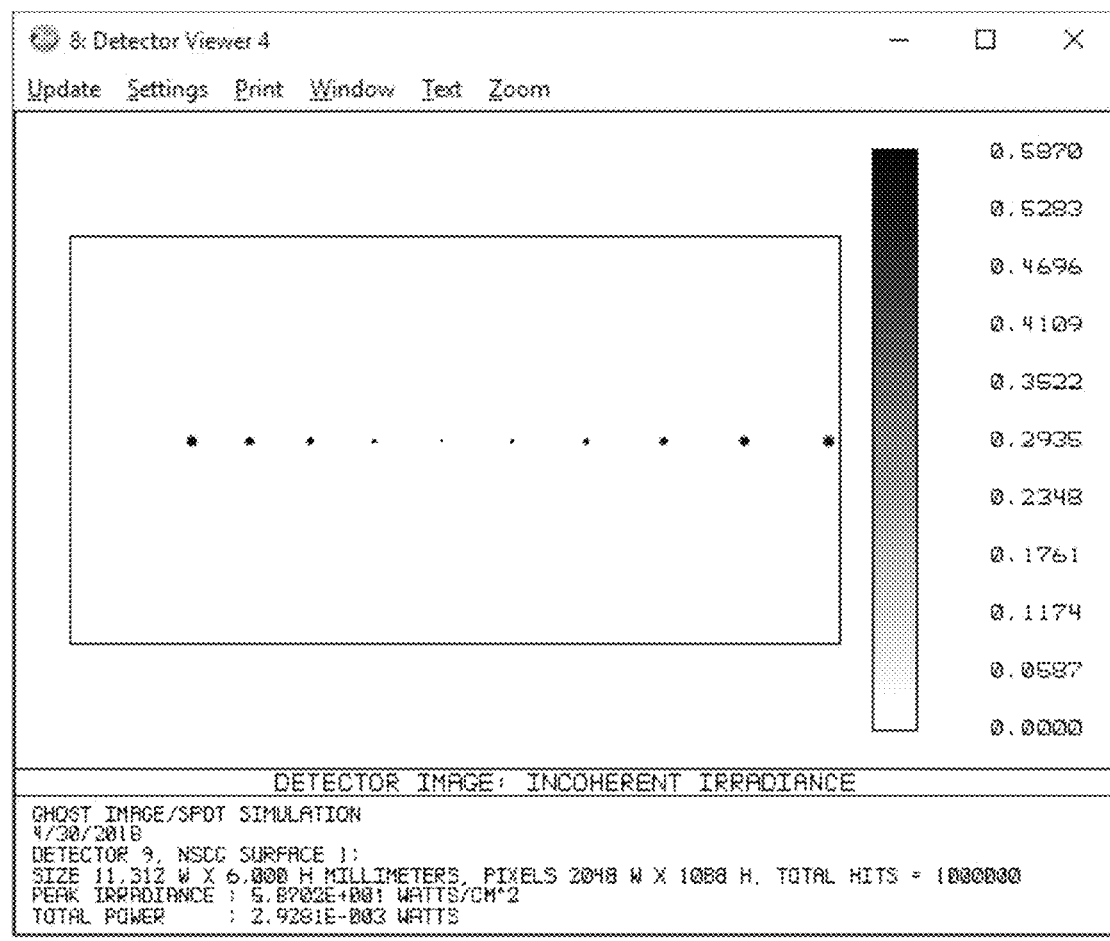
FIG. 14 illustrates the reduction in the ghost image resulting from the laser imaging system shown in FIG. 6, in accordance with an embodiment of the present invention.

FIG. 14 illustrates the resulting images seen by the detector with reference to the embodiment in FIG. 6, wherein the optical element 620 is a Schott® NG11 absorptive neutral density filter. As can be seen in FIG. 14, the ghost image is suppressed for the given exposure time of the detector. Additionally, utilizing a more absorbing filter such as Schott® NG1, NG4, NG5, NG9, or any other absorbing filters known in the art, would increase this ratio, while at the same time reducing the intensity of the transmitted beam to be measured, without requiring that a second absorbing filter be placed in front of the detector.

Accordingly, in this embodiment the present invention provides an improved laser imaging system that is effective in reducing ghost images seen by the detector of the imaging system, thereby improving the ability of the detector to accurately analyze an incident laser.

In another exemplary embodiment, the present invention provides a system and method that also improves the signal-to-noise ratio of the laser beam incident on the pixelated detector for the lower intensity spots in the third or further Rayleigh ranges, thereby improving the ability of the system to measure the laser beam.

Figure 15:
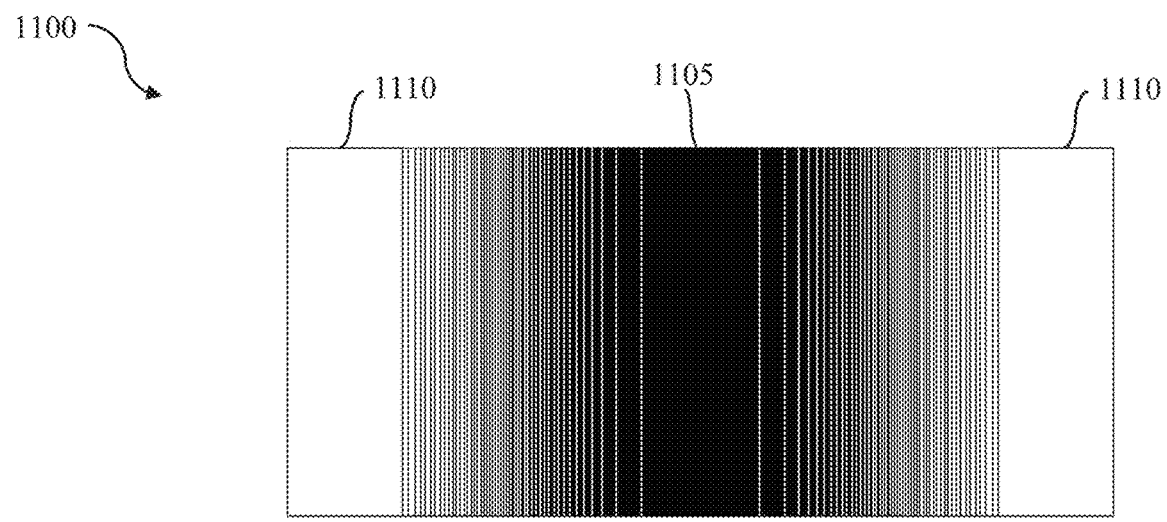
FIG. 15 illustrates a top-down view of linear apodizing filter coating deposited onto an absorbing glass filter substrate, in accordance with an embodiment of the present invention.

One embodiment of the present invention for increasing the beam intensity in the third Rayleigh range for a laser imaging system includes a linear apodizing filter. FIG. 15 illustrates a front view of a linear apodizing filter 1100 in accordance with an embodiment of the present invention. Linear apodizing filters are known in the art and are commonly used to eliminate undesirable intensity variations in optical systems. In a particular embodiment, the linear apodizing filter 1100 of the present invention may include a metal coating 1105 deposited onto an absorbing neutral density filter glass 1110, such as a Schott NG4, NG5 or NG11. However, the absorbing glass 1110 is not intended to be limited to these exemplary glasses and any filter glass that provides an optical density (OD)≤−1.0 will be effective in the linear apodizing filter 1100 of the present invention. As previously described, the absorbing filter glass is effective in suppressing the second surface ghost reflection, which is due to Fresnel reflections.

In the linear apodizing filter 1100 shown in FIG. 15, the coating 1105 on the ND filter glass 1110 is metal. While other coatings, such as a dielectric filter coating may be used for the apodizing filter 1100, metal is easier to deposit and less expensive than a dielectric filter coating. The transmission of the apodizing coating 1105 is designed to approximate a Gaussian intensity distribution in a single axis, but minimally, such that the transmission of the center of the coating 1105 is approximately a factor of 10 less than the transmission at the edges of the coating 1105. This difference in transmission across the coating 1105 accommodates the intensity fall-off from the first Rayleigh range to the third Ralyeigh range, by a factor of 10, as previously described. In general, the transmission profile of the apodizing filter 1100 approaches a maximum at its edges. As can be seen in FIG. 15, the metal coating 1105 is more concentrated near the center of the apodizing filter 1100 and is less concentrated at the edges of the apodizing filter 1100 resulting in a transmission profile that approaches a maximum at the edges of the apodizing filter 1100.

Figure 16:
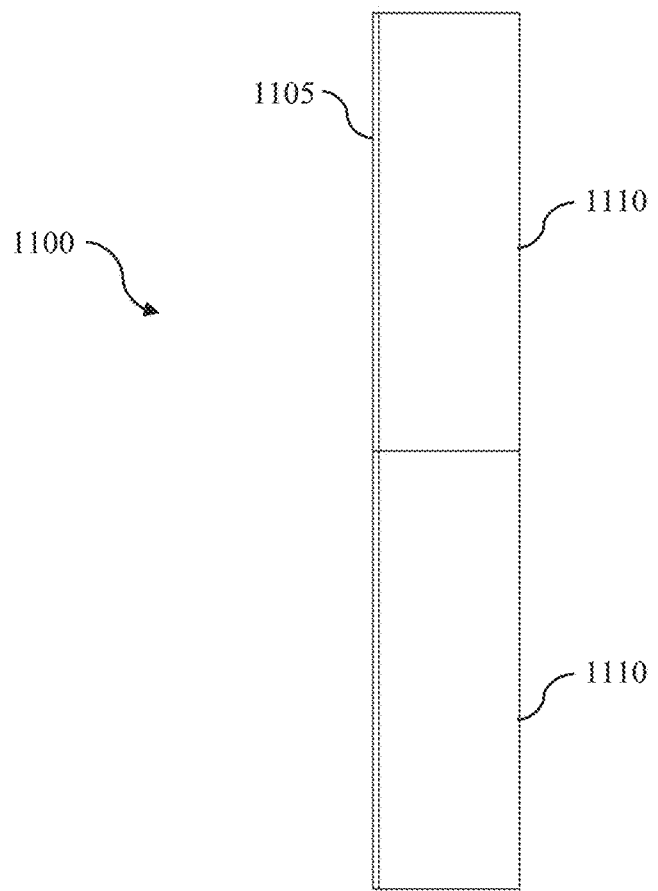
FIG. 16 illustrates a side-view of the linear apodizing filter coating deposited onto an absorbing glass filter substrate in FIG. 15.

FIG. 16 illustrates a side-view of the apodizing filter, show in FIG. 15, in accordance with an embodiment of the present invention.

In additional embodiments of the invention, it is possible to emulate the linear apodizing filter coating of FIG. 15 and FIG. 16 to provide a transmission profile that approaches a maximum at its edges by combining various optical components made of different types of glass.

Figure 17:
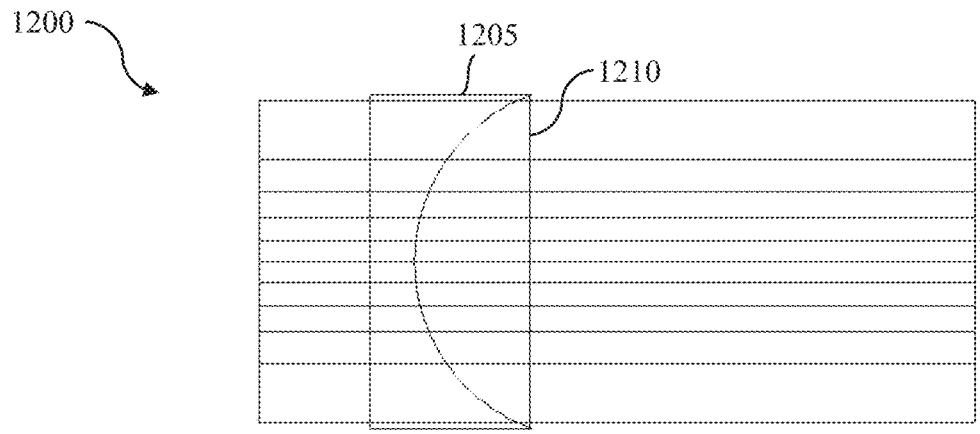
FIG. 17 illustrates a radial apodizing filter comprising a cylindrical plano-concave lens optically bonded to a cylindrical piano-convex lens of equal curvature, in accordance with an embodiment of the present invention.

In a second embodiment of the present invention for increasing the laser beam intensity in the third Rayleigh range, a radial apodizing filter is provided. FIG. 17 illustrates an exemplary radial apodizing filter 1200 which includes, a cylindrical piano-concave lens 1205 optically bonded to a cylindrical piano-convex lens 1210. In this embodiment, the plano-concave lens 1205 and the plano-convex lens 1210 are of equal radius of curvature, have a matching index of refraction and are optically bonded to each other with an index matching adhesive. The index of refraction of the cylindrical plano-concave lens 1205 and the cylindrical piano-convex lens 1210 should be matched to at least about one decimal point to avoid ghosting Fresnel reflections. In this embodiment, the plano-convex lens 1210 is made of an absorbing glass, such as Schott NG3, NG4 or NG5, or any such filter glass that provides the required 10 times intensity reduction between the center and the edges of the optic. Due to the shape of the piano-convex lens 1210, the optic acts like a linear apodizing filter which takes on the shape of the lens and the absorbing filter curve matches the shape of the lens. Since both the plano-concave lens 1205 and the plano-convex lens 1210 have the same radius of curvature, but opposite signs, no optical power will be introduced and the optic assembly 1200 essentially performs like a thick window.

Figure 18:
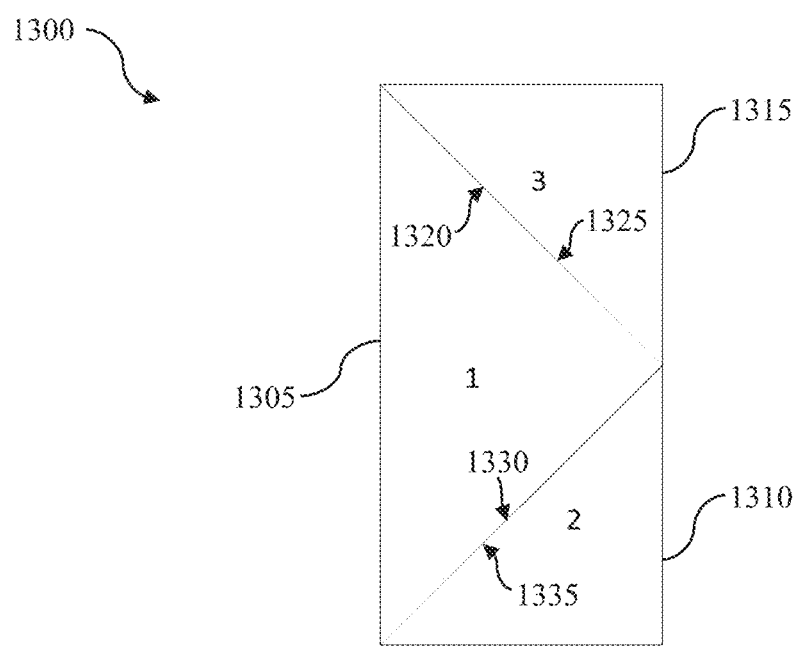
FIG. 18 illustrates a prism apodizing filter comprising one prism made from an absorbing filter glass and two other prism made from normal transparent glass, in accordance with an embodiment of the present invention.

FIG. 18 illustrates a third embodiment, wherein the apodizing filter is realized by a prism assembly 1300. This figure is a top-down view from the base of the prism assembly comprising three triangular prisms. In this embodiment, a first triangular prism 1305 is fabricated from an absorbing filter glass, such as a Schott NG4, NG5 or NG11 glass and a second triangular prism 1310 and a third triangular prism 1315 are made from a transparent glass having an index of refraction comparable to within about one decimal point of the index of refraction of the absorbing filter glass of the first triangular prism 1305. The second triangular prism 1310 and the third triangular prism 1315 are substantially identical prisms that are approximately half the size of the first triangular prism 1305. The second triangular prism 1310 and the third triangular prism 1315 are optically bonded to the first triangular prism 1305. A first lateral side 1320 of the first triangular prism 1305 is bonded to a lateral side 1325 of the third triangular prism 1315 and a second lateral side 1330 of the first triangular prism 1305 is bonded to a lateral side 1335 of the second triangular prism 1310. As shown, the bases of the three triangular prisms 1305, 1310, 1315 forming the apodizing filter form a rectangle. The configuration of the prism assembly 1300 of the present invention provides a linear triangular intensity filter having a transmission profile that approaches a maximum at its edges, thereby improving the signal-to-noise ratio of the laser beam incident on the pixelated detector for the lower intensity spots in the third or further Rayleigh ranges.

Figure 19:
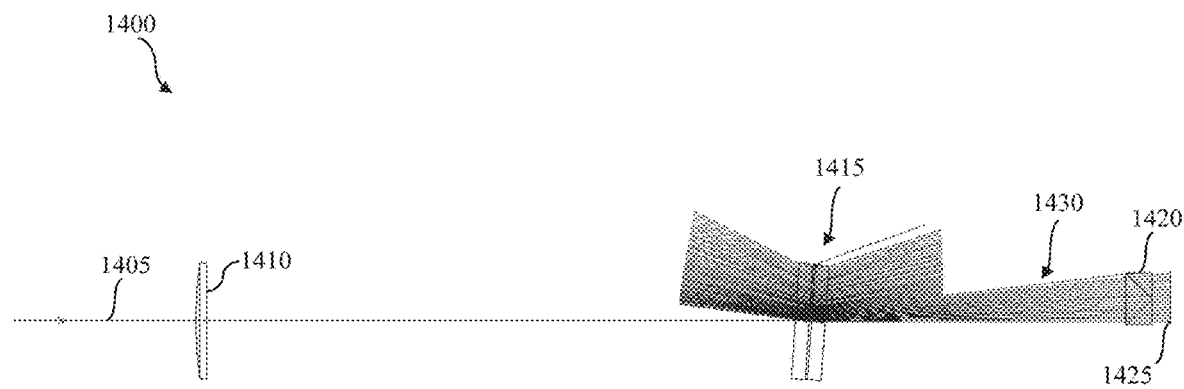
FIG. 19 illustrates a laser beam analysis system incorporating a prism apodizing filter, in accordance with an embodiment of the present invention.

FIG. 19 illustrates a laser beam analysis system 1400 which includes the novel, linear triangular intensity filter using the prism arrangement shown in FIG. 18. The beam analysis system 1400 includes a laser providing a laser beam 1405, a focusing lens 1410, a Fabry-Perot etalon pair 1415, the linear triangular intensity filter 1420 and a pixelated detector 1425. The linear triangular intensity filter 1420 is positioned in close proximity to the pixelated detector 1425. In this embodiment, the laser beam 1405 is focused by the focusing lens 1410 onto the Fabry-Perot etalon pair 1415 wherein the laser beam 1405 is subjected to multiple reflections and associated splitting of the laser beam 1405 within the Fabry-Perot resonator arrangement. As such, each subsequently transmitted beam 1430 that is incident upon the pixelated detector 1425 is about 1% less in intensity. Additionally, in accordance with the present invention, the transmitted beam 1430 is incident upon the linear triangular intensity filter 1420 and the linear triangular intensity filter 1420 is effective in improving the signal-to-noise ratio of the laser beam that is incident upon the pixelated detector 1425, thereby improving the ability of the pixelated detector 1425 to detect the lower intensity spots in the third and higher Rayleigh ranges.

Figure 20:
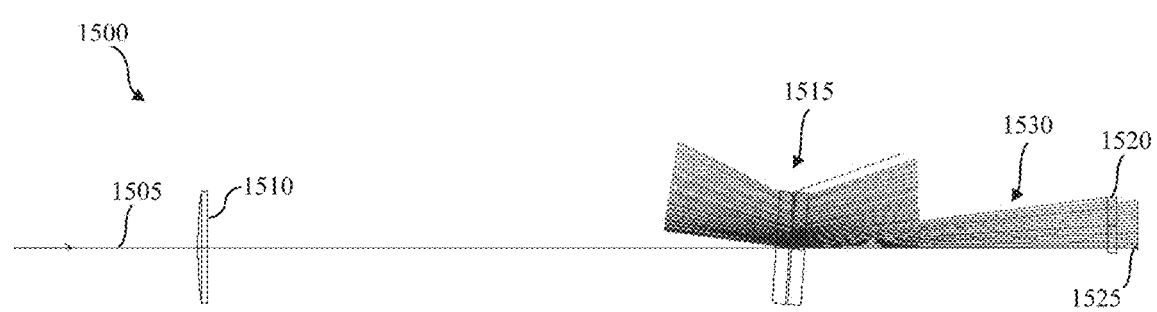
FIG. 20 illustrates a laser beam analysis system incorporating a linear apodizing filter, in accordance with an embodiment of the present invention.

FIG. 20 illustrates a laser beam analysis system 1500 which includes the novel, apodizing filter illustrated in FIG. 15 and FIG. 16. The beam analysis system 1500 in this embodiment includes a laser providing a laser beam 1505, a focusing lens 1510, a Fabry-Perot etalon pair 1515, the linear apodizing filter 1520 and a pixelated detector 1525. The linear apodizing filter 1520 is positioned in close proximity to the pixelated detector 1525. In this embodiment, the laser beam 1505 is focused by the focusing lens 1510 onto the Fabry-Perot etalon pair 1515 wherein the laser beam 1505 is subjected to multiple reflections and associated splitting of the laser beam 1505 within the Fabry-Perot resonator arrangement. As such, each subsequently transmitted beam 1530 that is incident upon the pixelated detector 1525 is about 1% less in intensity. Additionally, in accordance with the present invention, the transmitted beam 1530 is incident upon the linear apodizing filter 1520 and the linear apodizing filter 1520 is effective in improving the signal-to-noise ratio of the laser beam that is incident upon the pixelated detector 1525, thereby improving the ability of the pixelated detector 1525 to detect the lower intensity spots in the third and higher Rayleigh ranges. Additionally, since the substrate of the linear apodizing filter 1520 is fabricated of an absorbing glass, the linear apodizing filter is also effective in reducing the second surface ghost reflections from interfering with the measurements made by the pixelated detector 1525.

Figure 21:
FIG. 21 illustrates a laser beam analysis system incorporating a radial apodizing filter in accordance with an embodiment of the present invention.

FIG. 21 illustrates a laser beam analysis system 1600 which includes the novel, radial apodizing filter using the prism arrangement shown in FIG. 17. The beam analysis system 1600 in this embodiment includes a laser providing a laser beam 1605, a focusing lens 1610, a Fabry-Perot etalon pair 1615, the radial apodizing filter 1620 and a pixelated detector 1625. The radial apodizing filter 1620 is positioned in close proximity to the pixelated detector 1625. In this embodiment, the laser beam 1605 is focused by the focusing lens 1610 onto the Fabry-Perot etalon pair 1615 wherein the laser beam 1605 is subjected to multiple reflections and associated splitting of the laser beam 1605 within the Fabry-Perot resonator arrangement. As such, each subsequently transmitted beam 1630 that is incident upon the pixelated detector 1625 is about 1% less in intensity. Additionally, in accordance with the present invention, the transmitted beam 1630 is incident upon the radial apodizing filter 1620 and the radial apodizing filter 1620 is effective in improving the signal-to-noise ratio of the laser beam that is incident upon the pixelated detector 1625, thereby improving the ability of the pixelated detector 1625 to detect the lower intensity spots in the third and higher Rayleigh ranges. Additionally, since the lens of the radial apodizing filter 1620 is fabricated of an absorbing glass, the radial apodizing filter is also effective in reducing the second surface ghost reflections from interfering with the measurements made by the pixelated detector 1625.

Figure 22:
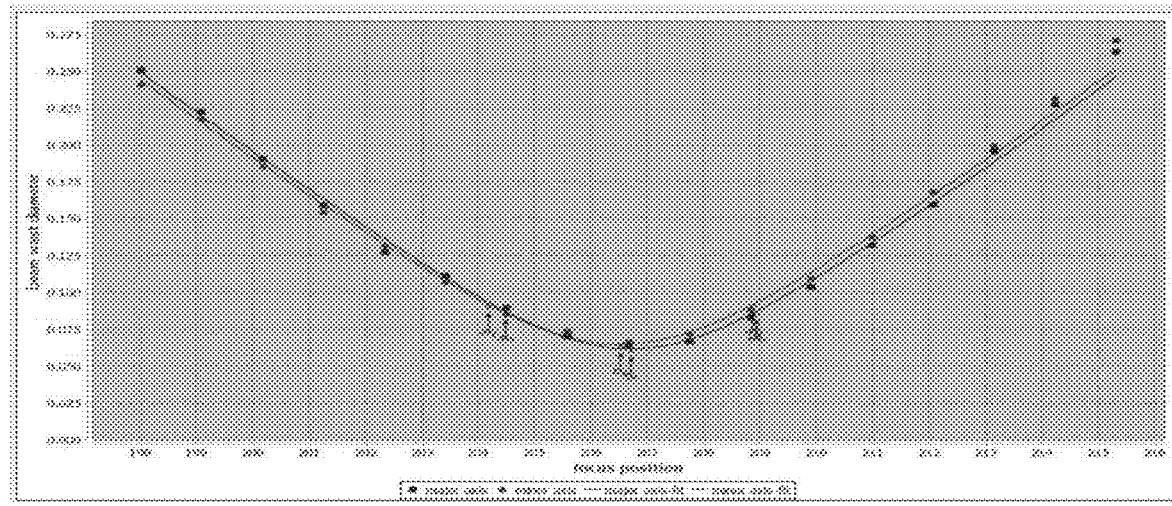
FIG. 22 illustrates a beam caustic plot of spatial time slice through +/−4 Rayleigh ranges from a laser beam analysis system incorporating a linear apodizing filter, in accordance with an embodiment of the present invention.

In an exemplary embodiment, a linear apodizing filter was fabricated and tested with a laser beam analysis system and placed is close proximity to the pixelated detector, as illustrated in FIG. 20. In this exemplary embodiment, the laser was a low $M^2$ continuous wave laser fiber operating at 1070 nm. The focusing lens was an F=201.4 mm lens. The nominal size of the linear apodizing filter was 23.5 mm×12.5 mm×1.89 mm and was comprised of Schott Glass NG4 filter glass a metalized linear apodizing coating deposited to emulate a Gaussian attenuation from an OD=−2.0 to 0 over the 23.5 mm dimension. FIG. 22 illustrates a beam caustic plot of spatial time slice through +/−4 Rayleigh ranges from this exemplary real-time beam analysis. It can be seen from the beam caustic that the plot is covering +/−4 Rayleigh ranges before the signal intensity decreases to a level that the pixelated detector cannot easily measure without measuring noise. Accordingly, the embodiment includes spots into the third Rayleigh range and as such, the system is ISO 11146-1:2005 compliant.

Figure 23:
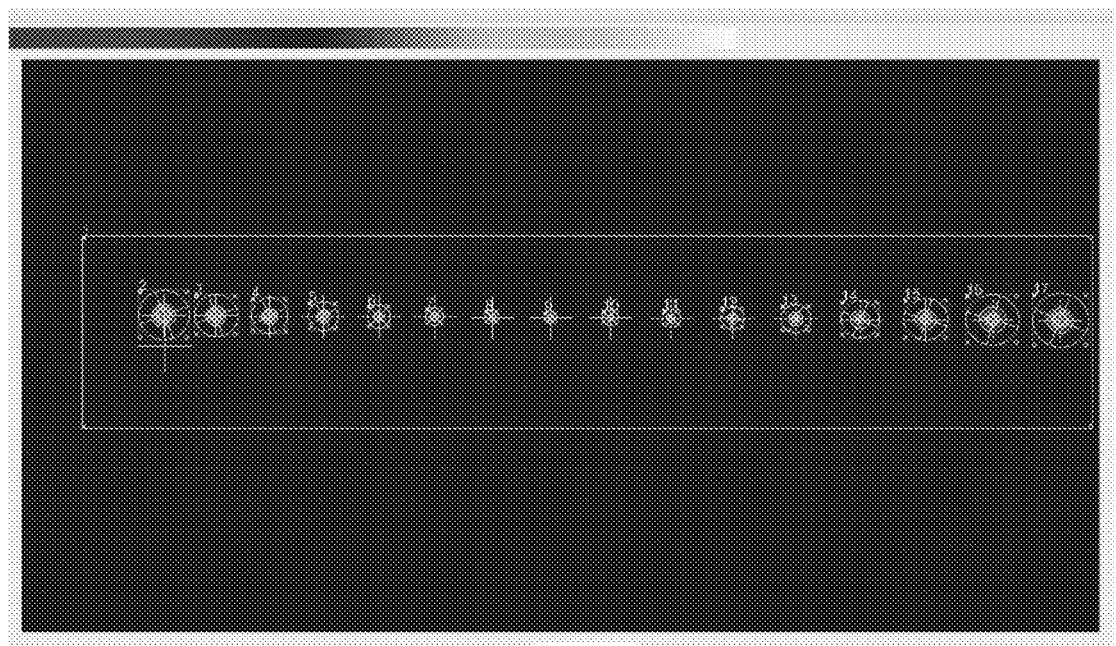
FIG. 23 is a frame grabber screen illustrating the signal-to-noise ratio from the first to the fourth Rayleigh ranges showing comparable signal-to-noise ratios utilizing a laser beam analysis system incorporating a linear apodizing filter, in accordance with an embodiment of the present invention.

FIG. 23 illustrates a frame grabber screen resulting from the operation of the exemplary embodiment utilizing a linear apodizing filter. As shown in FIG. 23, the use of the linear apodizing filter in the real-time beam analysis system is effective in reducing the signal-to-noise ratio of the fourth Rayleigh ranges to a ratio that comparable to that of the first Rayleigh range.

Accordingly, in this embodiment the present invention provides an improved laser imaging system that is effective in improving the signal-to-noise ratio of the laser beam incident on the pixelated detector, thereby increasing the beam intensity of the laser beam seen by the detector of the imaging system and improving the ability of the detector to accurately analyze an incident laser.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A method for measuring a laser beam in a laser imaging system, the method comprising:
   positioning an apodizing filter between a pixelated detector and a laser source, wherein the apodizing filter comprises an absorbing glass having an optical density (OD) of at least −1, and wherein the apodizing filter has a transmission profile that approaches a maximum at its edges;
   emitting a laser beam, from the laser source, onto the apodizing filter; and
   transmitting at least a portion of laser beam through the apodizing filter to the pixelated detector based upon the transmission profile of the apodizing filter.

2. The method of claim 1, wherein the transmission profile of the apodizing filter is about 10 times less at a center of the apodizing filter than at the edges of the apodizing filter.

3. The method of claim 1, further comprising:
   measuring the portion of the laser beam incident upon the pixelated detector, wherein an intensity of the portion of the laser beam in a first Rayleigh range is substantially equal to an intensity of the portion of the laser beam in a third Rayleigh range.

4. The method of claim 1, wherein the apodizing filter comprises:
   a substrate comprising the absorbing glass having an optical density (OD) of at least −1; and
   a metal coating deposited on the substrate, wherein the metal coating establishes the transmission profile of the apodizing filter that approaches a maximum at the edges of the substrate.

5. The method of claim 4, wherein the laser beam in incident upon the metal coating and wherein the method further comprises:
   transmitting a portion of the light incident upon the metal coating of the apodizing filter to the absorbing glass of the apodizing filter;
   reflecting a portion of light incident upon the absorbing glass of the apodizing filter; and
   absorbing the reflected portion of light, by the absorbing glass, to reduce ghost images at the pixelated detector.

6. The method of claim 1, wherein the apodizing filter comprises:
   a cylindrical plano-concave lens; and
   a cylindrical plano-convex lens fabricated from the absorbing glass, wherein the cylindrical plano-concave lens and the cylindrical plano-convex lens have substantially the same radius of curvature, wherein an index of refraction of the cylindrical plano-convex lens and an index of refraction of the cylindrical plano-concave lens are substantially equal and wherein the radius of curvature establishes the transmission profile of the apodizing filter.

7. The method of claim 6, wherein the cylindrical plano-concave lens is optically bonded to the cylindrical plano-convex lens using a bonding agent having an index of refraction substantially equal to the index of refraction of the cylindrical plano-concave lens and the cylindrical plano-convex lens or by atomic bonding.

8. The method of claim 1, wherein the apodizing filter comprises:
   a first triangular prism fabricated of the absorbing glass;
   a second triangular prism fabricated of a substantially transparent glass; and
   a third triangular prism fabricated of a substantially transparent glass, wherein a lateral face of the second triangular prism is optically bonded to a first lateral face of the first triangular prism and a lateral face of the second triangular prism is optically bonded to a second lateral face of the second triangular prism and wherein dimensions of the second triangular prism and the third triangular prism are substantially equal and dimensions of the first triangular prism are approximately twice those of the second triangular prism and the third triangular prism.

9. The method of claim 8, wherein an index of refraction of the first triangular prism, the second triangular prism and the third triangular prism are substantially equal.

10. The method of claim 8, wherein the optical bonding is accomplished using a bonding agent having an index of refraction substantially equal to the index of refraction of the first triangular prism, the second triangular prism and the third triangular prism or by atomic bonding.

11. An apparatus for measuring a laser beam in a laser imaging system, the apparatus comprising:
    a pixelated detector to analyze a laser beam emitted from a laser source; and
    an apodizing filter positioned between the pixelated detector and the laser source, wherein the apodizing filter has a transmission profile that approaches a maximum at its edges and wherein the apodizing filter comprises an absorbing glass having an optical density (OD) of at least −1.

12. The apparatus of claim 11, wherein the transmission profile of the apodizing filter is about 10 times less at a center of the apodizing filter than at the edges of the apodizing filter.

13. The apparatus of claim 11, wherein the transmission profile of the apodizing filter results in a laser beam incident upon the pixelated detector having an intensity in a first Rayleigh range that is substantially equal to an intensity in a third Rayleigh range.

14. The apparatus of claim 11, wherein the apodizing filter comprises:
    a substrate comprising the absorbing glass; and
    a metal coating deposited on the substrate, wherein the metal coating establishes the transmission profile of the apodizing filter that approaches a maximum at the edges of the substrate.

15. The apparatus of claim 11, wherein the apodizing filter comprises:
    a plano-concave lens; and
    a plano-convex lens fabricated from the absorbing glass, wherein the plano-concave lens and the plano-convex lens have substantially the same radius of curvature, wherein an index of refraction of the plano-convex lens and an index of refraction of the plano-concave lens are substantially equal and wherein the radius of curvature establishes the transmission profile of the apodizing filter.

16. The apparatus of claim 15, wherein the plano-concave lens is optically bonded to the plano-convex lens using a bonding agent having an index of refraction substantially equal to the index of refraction of the plano-concave lens and the plano-convex lens or by atomic bonding.

17. The apparatus of claim 15, wherein the apodizing filter comprises:
- a first triangular prism fabricated of the absorbing glass;
- a second triangular prism fabricated of a substantially transparent glass; and
- a third triangular prism fabricated of a substantially transparent glass, wherein a lateral face of the second triangular prism is optically bonded to a first lateral face of the first triangular prism and a lateral face of the second triangular prism is optically bonded to a second lateral face of the second triangular prism and wherein dimensions of the second triangular prism and the third triangular prism are substantially equal and dimensions of the first triangular prism are approximately twice those of the second triangular prism and the third triangular prism.

18. The apparatus of claim 17, wherein an index of refraction of the first triangular prism, the second triangular prism and the third triangular prism are substantially equal.

19. The apparatus of claim 17, wherein the optical bonding is accomplished using a bonding agent having an index of refraction substantially equal to the index of refraction of the first triangular prism, the second triangular prism and the third triangular prism or by atomic bonding.

20. An apparatus for measuring a laser beam in a laser imaging system, the apparatus comprising:
- a Fabry-Perot cavity;
- a focusing lens to be positioned between a laser source and the Fabry-Perot cavity;
- a pixelated detector to analyze the laser beam emitted from the laser source; and
- an apodizing filter positioned between the pixelated detector and the Fabry-Perot cavity, wherein the apodizing filter has a transmission profile that approaches a maximum at its edges and wherein the apodizing filter comprises:
  - a substrate comprising an absorbing glass having an optical density (OD) of at least −1; and
  - a metal coating deposited on the substrate, wherein the metal coating establishes the transmission profile of the apodizing filter that is about 10 times less at a center of the apodizing filter than at the edges of the apodizing filter;
- a pixelated detector to analyze a laser beam emitted from a laser source;
- an absorptive neutral density filter positioned between the pixelated detector and the laser source;
  - the absorptive neutral density filter having a first surface facing the laser source and a second surface facing, and in close proximity to, the pixelated detector, and wherein the absorptive neutral density filter attenuates incident radiation from the laser source uniformly independent of wavelength, and wherein the second surface comprises an anti-reflective coating and the first surface is a highly reflective surface; and
  - the absorptive neutral density filter for receiving a laser beam emitted from the laser source, for transmitting a portion of light incident upon the first surface of the absorptive neutral density filter to the second surface of the absorptive neutral density filter, for reflecting a portion of light incident upon the second surface of the absorptive neutral density filter and for absorbing the reflected portion of light to reduce ghost images at the pixelated detector.

* * * * *